US006096476A

United States Patent [19]

Yanagida et al.

[11] Patent Number: 6,096,476

[45] Date of Patent: Aug. 1, 2000

[54] DIRECT DRAWING TYPE WATERLESS PLANOGRAPHIC ORIGINAL FORM PLATE

[75] Inventors: Shun-ichi Yanagida; Norimasa Ikeda; Ken Kawamura; Yuzuru Baba; Michihiko Ichikawa; Kouichi Fujimaru, all of Shiga, Japan

[73] Assignee: Toray Industries, Inc., Tokyo, Japan

[21] Appl. No.: 08/875,547

[22] PCT Filed: Nov. 8, 1996

[86] PCT No.: PCT/JP96/03296

§ 371 Date: Oct. 27, 1997

§ 102(e) Date: Oct. 27, 1997

[87] PCT Pub. No.: WO97/17208

PCT Pub. Date: May 15, 1997

[30] Foreign Application Priority Data

| | | | |
|---|---|---|---|
| Aug. 11, 1995 | [JP] | Japan | 7-289764 |
| Aug. 11, 1995 | [JP] | Japan | 7-289765 |
| Aug. 11, 1995 | [JP] | Japan | 7-289766 |
| Sep. 11, 1995 | [JP] | Japan | 7-291290 |
| Sep. 11, 1995 | [JP] | Japan | 7-291291 |
| Sep. 11, 1995 | [JP] | Japan | 7-291292 |
| Nov. 30, 1995 | [JP] | Japan | 7-313172 |
| Jul. 19, 1996 | [JP] | Japan | 8-191158 |

[51] Int. Cl.[7] .......... G03F 7/004

[52] U.S. Cl. .......... 430/270.1; 430/303

[58] Field of Search .......... 430/303, 271.1, 430/273.1, 272.1

[56] References Cited

U.S. PATENT DOCUMENTS

| | | | |
|---|---|---|---|
| 4,342,820 | 8/1982 | Kinashi et al. | 430/11 |
| 4,568,629 | 2/1986 | Kinashi et al. | 430/272 |
| 5,062,364 | 11/1991 | Lewis et al. | 101/467 |
| 5,225,309 | 7/1993 | Suzuki et al. | 430/158 |
| 5,334,486 | 8/1994 | Abe et al. | 430/288 |
| 5,378,580 | 1/1995 | Leenders | 430/303 |
| 5,437,963 | 8/1995 | Verburgh et al. | 430/262 |
| 5,536,619 | 7/1996 | Verburgh | 430/273.1 |
| 5,786,125 | 7/1998 | Tsuchiya et al. | 430/272.1 |
| 5,811,210 | 9/1998 | Kawamura et al. | 430/17 |
| 5,871,883 | 2/1999 | Hirano et al. | 430/272.1 |

FOREIGN PATENT DOCUMENTS

| | | |
|---|---|---|
| 0 333 156 | 9/1989 | European Pat. Off. . |
| WO 91/04154 | 4/1991 | European Pat. Off. . |
| 0 573 091 | 12/1993 | European Pat. Off. . |
| 0 672 950 | 4/1995 | European Pat. Off. . |
| 0 678 785 | 5/1995 | European Pat. Off. . |
| 0 678 785 | 10/1995 | European Pat. Off. . |
| 63-293091 | 11/1988 | Japan . |
| 4-263994 | 6/1994 | Japan . |
| 1444381 | 7/1976 | United Kingdom . |
| WO 90/02044 | 3/1990 | WIPO . |
| WO 93/09957 | 5/1993 | WIPO . |

OTHER PUBLICATIONS

Database WPI, Section Ch, Week 8302 Derwent Publications, Ltd., London GB Class A26, AN 83–03219K, XP–002095465.

Patent Abstracts of Japan, vol. 10, No. 093 (P–445), Apr. 10, 1986 & JP 60 229031A; Nov. 14, 1985, abstract.

*Primary Examiner*—Janet Baxter
*Assistant Examiner*—Barbara Gilmore
*Attorney, Agent, or Firm*—Morrison & Foerster, LLP

[57] ABSTRACT

A directly imageable raw plate for waterless planographic printing plate, in which a heat insulating layer, heat sensitive layer and ink repellent layer are formed in this order on a substrate, comprising physical properties of 5 to 100 kgf/$mm^2$ in initial elastic modulus and 0.05 to 5 kgf/$mm^2$ in 5% stress as tensile properties of the heat sensitive layer or the heat insulating layer or the laminate consisting of both the layers.

It can be suitably used also for large printing presses and web offset printing presses requiring high printing durability, and makes it possible to obtain an economically advantageous printing plate.

22 Claims, No Drawings

DIRECT DRAWING TYPE WATERLESS PLANOGRAPHIC ORIGINAL FORM PLATE

TECHNICAL FIELD

The present invention relates to a directly imageable raw plate for waterless planographic printing plate which can be used without using dampening water, and a waterless planographic printing plate obtained by selectively forming an image on the directly imageable raw plate for waterless planographic printing plate and developing it. In more detail, it relates to a directly imageable raw plate for waterless planographic printing plate remarkably improved in printing durability and developability, and a waterless planographic printing plate obtained by selectively and directly forming an image on the directly imageable raw plate for waterless planographic printing plate by a laser beam and developing it.

BACKGROUND ARTS

Making a planographic printing plate using silicone rubber or fluorine resin as the ink repellent layer without using dampening water, especially direct plate making which makes an offset printing plate without using any film for plate making has been used in the short run printing industry, and begins to be used also in the areas of offset printing and gravure printing because of such features as simplicity not requiring any high skill, speediness to allow a printing plate to be obtained in a short time, rationality to allow a system optimum in view of desired quality and cost to be selected among diverse systems. Especially recently in the rapid progress of output systems such as prepress systems, image setters and laser printers, new types of various planographic printing plates have been developed. The methods for making these planographic printing plates can be classified into methods of irradiating with a laser beam, methods of writing by a thermal head, methods of selectively applying voltages by pin electrodes, methods of forming an ink repellent layer or inking layer by ink jet, etc.

Among them, the methods of using a laser beam are more excellent than other methods in view of resolution and plate making speed.

For example, as directly imageable raw plate for waterless planographic printing plates, JP-B-42-21879, U.S. Pat. Nos. 4,519,40, 5,339,739 (6,243,1), 1,253,19, 5,928,3, etc. propose directly imageable raw plate for waterless planographic printing plates in which a heat sensitive layer containing an infrared absorbing material and a self oxidizing material and an ink repellent silicone rubber layer are laminated on a substrate. Furthermore, U.S. Pat. No. 2,470,14 proposes a directly imageable raw plate for waterless planographic printing plate in which a heat sensitive layer and an ink repellent silicone rubber layer are laminated on a substrate. However, in these directly imageable raw plate for waterless planographic printing plates, since the heat sensitive layer is hard and fragile, the stress acting on the plate surface during offset printing acts intensively at the interface between the heat sensitive layer and the silicone rubber layer, to cause adhesion rupture. Furthermore, the heat sensitive layer is likely to be damaged, and according to the increase of printed sheets, the heat sensitive layer below the ink repellent layer is damaged in the non-image area, and this phenomenon erodes the ink repellent layer, to lower image reproducibility disadvantageously. As a result, the printing durability of the printing plate becomes insufficient disadvantageously. Studies have been made for the purpose of improving the printing durability. U.S. Pat. No. 2,470,16 proposes a plate in which a silicone rubber layer is anchored by an adhesion accelerator such as a silane coupling agent, and according to this proposal, though the adhesiveness to the heat sensitive layer is improved, practically sufficient printing durability cannot be obtained. Thickening the ink repellent layer has also been attempted, but the decline of sensitivity caused by thickening and the shortening of ink mileage occur disadvantageously. To overcome these problems, various studies have been made for photosensitive waterless planographic printing plates. JP-A-1-161242, JP-A-1-154159, etc. propose to thicken the ink repellent silicone rubber layer, while compensating the shortening of ink mileage due to thickening, by adjusting the cell depth, for example, by embedding an ink acceptable material. In this case, the problem of decline of sensitivity remains unsolved, and an additional new step of embedding an ink acceptable material, etc. poses another problem of practical inconvenience. A plate with a filler added into the ink repellent silicone rubber layer is also studied, but it is insufficient in the improvement of printing durability though the resistance against the flaws caused by the washing of plate surface, etc. can be improved. In addition, there arises a problem that the ink repellency required in the silicone rubber layer declines greatly. U.S. Pat. No. 5,379,698 describes a directly imageable raw plate for waterless planographic printing plate using a thin metallic film as the heat sensitive layer. In this case, since the thin metallic film itself allows the transmittance of the laser beam to some extent, the sensitivity declines. To prevent it, a reflection layer must be formed below the thin metallic layer, to require an additional coating step disadvantageously in view of cost. JP-B-6-199064, U.S. Pat. No. 5,353,705 and EPO 580393 also describe directly imageable raw plate for waterless planographic printing plates using a laser beam as the light source. The original printing plates of heat destruction type use carbon black as a laser beam absorbing compound and nitrocellulose as a thermally decomposing compound. These printing plates are better than the printing plate using a thin metallic film in laser beam absorption efficiency, but have a problem that they are likely to be flawed during printing and low in printing durability since the adhesive strength between the silicone rubber layer on the surface and the heat sensitive layer is weak. Furthermore, though carbon black is used as a laser beam absorbing material, all the primary grains of the carbon black used in the above patent are 30 $\mu$m or more in diameter, and it cannot be said that the carbon block absorbs the light of a semiconductor laser (about 800 nm in wavelength) efficiently. The reason is that the optical density as a printing plate which is one of indicators of laser beam absorption efficiency does not become maximum at the grain size. The optical density becomes maximum when the grain size is about 20 $\mu$m, and the blackness declines at a grain size of larger than 30 $\mu$m. If the grain size is smaller than 15 $\mu$m, dispersibility declines. Furthermore, since the carbon black stated in said patent is large in oil absorption, i.e., has a high structure, it has a problem that the solution destined to be the heat sensitive layer cannot be applied to form a uniform film since carbon black grains cohere to each other, to raise the viscosity of the solution. On the other hand, the directly imageable raw plate for waterless planographic printing plate with a thin metallic film as the heat sensitive layer has a problem that a reflection layer must be formed below the thin metallic film since the thin metallic film allows some transmittance of the laser beam, though a very sharp image and high resolution can be obtained since the heat sensitive layer is very thin. Moreover, few apparatuses are introduced for efficiently and stably massproducing these directly imageable raw plate for waterless planographic printing plates.

The present invention has been created to improve the respective disadvantages of the prior arts, and provides a directly imageable raw plate for waterless planographic printing plate remarkably improved in printing durability without lowering the developability, image reproducibility, printability and solvent resistance of the plate by using specific compounds or materials for forming the heat sensitive layer and the heat insulating layer as flexible layers, and specifying the initial elastic modulus and 5% stress as tensile properties for the flexibility of the heat sensitive layer or the heat insulating layer or a laminate consisting of both the layers.

DISCLOSURE OF THE INVENTION

The object of the present invention is to obtain a directly imageable raw plate for waterless planographic printing plate.

The object can be achieved by a directly imageable raw plate for waterless planographic printing plate, in which a heat insulating layer, a heat sensitive layer and an ink repellent layer are formed in this order on a substrate, comprising physical properties of 5 to 100 $kgf/mm^2$in initial elastic modulus and 0.05 to 5 $kgf/mm^2$ in 5% stress as tensile properties of the heat sensitive layer or the heat insulating layer or the laminate consisting of both the layers.

THE MOST PREFERRED EMBODIMENTS OF THE INVENTION

At first, the heat insulating layer and the heat sensitive layer are described below.

The tensile properties of the heat insulating layer or the heat sensitive layer or the laminate consisting of both the layers of the present invention must be 5 to 100 $kgf/mm^2$ in initial elastic modulus and 0.05 to 5 $kgf/mm^2$ in 5% stress.

The initial elastic modulus must be 5 to 100 $kgf/mm^2$, preferably 10 to 60 $kgf/mm^2$. If the initial elastic modulus is less than 5 $kgf/mm^2$, the heat insulating layer becomes sticky, to inconvenience the operation of production, and hickeys, etc. are caused during printing unpreferably. The 5% stress must be 0.05 to 5 $kgf/mm^2$, preferably 0.1 to 3 $kgf/mm^2$. If the 5% stress is less than 0.05 $kgf/mm^2$, the heat insulating layer and the heat sensitive layer become sticky to inconvenience the operation of production unpreferably. If the 5% stress is more than 5 $kgf/mm^2$, the repeated stress during printing is likely to destroy the heat sensitive layer or the adhesion interface between the heat sensitive layer and the silicone rubber layer laminated on it, and so, the printing durability declines unpreferably.

The tensile properties can be measured according to JIS K 6301. For measurement, a glass sheet is coated with the solution destined to be a heat insulating layer and/or the solution destined to be a heat sensitive layer, and after the solvent has been evaporated, the remaining sheet is heated at 200° C., to be hardened. Then, an about 100 μm thick sheet as the heat insulating layer and/or the heat sensitive layer is removed from the glass sheet. From the sheet, strip samples of 5 mm×4 mm are cut off, and the initial elastic modulus and 5% stress are measured at a tensile speed of 20 cm/min using Tensilon RTM-100 (produced by Orientech K.K.).

To let the heat insulating layer and the heat sensitive layer have the above tensile properties, it is preferable to let the compositions of the heat insulating layer and the heat sensitive layer contain a binder resin. The binder resin in this case is not especially limited as far as it is soluble in an organic solvent and can form a film, but it is preferable to use a homopolymer or copolymer of 20° C. or lower in glass transition temperature (Tg). A homopolymer or copolymer of 0° C. or lower in Tg is more preferable. Furthermore, it is preferable that the heat sensitive layer as a whole has a crosslinked structure in view of UV ink resistance, etc.

The glass transition temperature (Tg) refers to the transition point (temperature) at which an amorphous high polymer physically changes from its vitreous state to its rubber state (or vice versa) in physical properties. In a relatively narrow temperature range with the transition point as the center, not only the elastic modulus but also such physical properties as expansion coefficient, heat content, refractive index, diffusion coefficient and dielectric constant change greatly. So, the measurement of the glass transition temperature can be classified into the measurement of any property of the entire material like volume (specific volume) vs. temperature curve measurement, heat content measurement by thermal analysis (DSC, DTA, etc.), refractive index measurement or rigidity measurement, and the measurement to identify the molecular motion like dynamic viscoelasticity, dielectric loss tangent and NMR spectrum. As a customary method, the volume of a sample is measured while the temperature is raised using a dilatometer, and the point at which the gradient of the volume (specific volume) vs. temperature curve suddenly changes is identified as the glass transition temperature.

As the binder resin with a function to hold the form in the present invention, any binder resin which can be diluted by an organic solvent and can form a film can be used. The binder resins which can be used in the present invention include the following, though not limited to them.

(1) Vinyl Polymers

Homopolymers and copolymers obtained from the following monomers and their derivatives:

For example, ethylene, propylene, 1-butene, styrene, butadiene, isoprene, vinyl chloride, vinyl acetate, methyl acrylate, ethyl acrylate, isopropyl acrylate, n-butyl acrylate, 2-ethylhexyl acrylate, methyl methacrylate, ethyl methacrylate, isopropyl methacrylate, n-butyl methacrylate, isobutyl methacrylate, n-hexyl methacrylate, lauryl methacrylate, acrylic acid, methacrylic acid, maleic acid, itaconic acid, 2-hydroxyethyl methacrylate, 2-hydroxypropyl methacrylate, 2-hydroxyethyl acrylate, 2-hydroxypropyl acrylate, polyethylene glycol mono(meth) acrylate, polypropylene glycol mono(meth)acrylate, phenoxyethyl (meth)acrylate, 2-(meth)acryloxyethylhydrogen naphthalate, 2-(meth)acryloxyethylhydrogen succinate, acrylamide, N-methylolacrylamide, diacetoneacrylamide, glycidyl methacrylate, acrylonitrile, styrene, vinyltoluene, isobutene, 3-methyl-1-butene, butyl vinyl ether, N-vinyl carbazole, methyl vinyl ketone, nitroethylene, methyl α-cyanacrylate, vinylidene cyanide, polyethylene glycol di(meth)acrylate, trimethylolethane tri(meth)acrylate, neopentyl glycol di(meth)acrylate, pentaerythritol tri(meth) acrylate, pentaerythritol tetra(meth)acrylate, dipentaerythritol hexa(meth)acrylate, hexanediol di(meth)acrylate, trimethylolpropane tri(acryloyloxypropyl) ether, glycerol, compounds obtained by adding ethylene oxide or propylene oxide to a polyfunctional alcohol such as glycerol, trimethylolethane or trimethylolpropane, and (meth)acrylating the addition product. Homopolymers and copolymers obtained by polymerizing or copolymerizing these monomers and their derivatives can be used as binder resins.

Vinyl based polymers of 20° C. or lower in glass transition temperature include the following, but the present invention is not limited thereto or thereby.

(a) Polyolefins

Poly(1-butene), poly(5-cyclohexyl-1-pentene), poly(1-decene), poly(1,1-dichloroethylene), poly(1,1-dimethylbutane), poly(1,1)-dimethylpropane), poly(1-dodecene), polyethylene, poly(1-heptene), poly(1-hexene), polymethylene, poly(6-methyl-1-heptene), poly(5-methyl-1-hexene), poly(2-methylpropane), poly(1-nonane), poly(1-octene), poly(1)-pentene), poly(5-phenyl-1-pentene), polypropylene, polyisobutylene, poly(butene), poly(vinyl butyl ether), poly(vinyl ethyl ether), poly(vinyl isobutyl ether), poly(vinyl methyl ether), etc.

(b) Polystyrenes

Poly(4-[(2-butoxyethoxy)methyl]styrene), poly(4-decylstyrene), poly(4-dodecylstyrene), poly[4-(2-ethoxyethoxy methyl)styrene], poly[4-(hexoxymethyl) styrene], poly(4-hexylstyrene), poly(4-nonylstyrene), poly [4-(octoxymethyl)styrene], poly(4-octylstyrene), poly(4-tetradecylstyrene), etc.

(c) Acrylate Polymers and Methacrylate Polymers

Poly(butyl acrylate), poly(sec-butyl acrylate), poly(tert-butyl acrylate), poly[2-(2-cyanoethylthio)ethyl acrylate], poly(3-(2-cyanoethylthio)propyl acrylate], poly[2-(cyanomethylihio)ethyl acrylate], poly[6-(cyanomethylthio) hexyl acrylate], poly[2-(3-cyanopropylthio)ethyl acrylate], poly(2-ethoxyethyl acrylate), poly(3-ethoxypropyl acrylate), poly(ethyl acrylate), poly(2-ethylbutyl acrylate), poly(2-ethylhexyl acrylate), poly(5-ethyl-2-nonyl acrylate), poly(2-ethylthioethyl acrylate), poly(3-ethylthiopropyl acrylate), poly(heptyl acrylate), poly(2-heptyl acrylate), poly(hexyl acrylate), poly(isobutyl acrylate), poly(isopropyl acrylate), poly(2-methoxyethyl acrylate), poly(3-methoxypropyl acrylate), poly(2-methylbutyl acrylate), poly (3-methylbutyl acrylate), poly(2-methyl-7-ethyl-4-undecyl acrylate), poly(2-methylpentyl acrylate), poly(4-methyl-2-pentyl acrylate), poly(4-methylthiobutyl acrylate), poly(2-methylthioethyl acrylate), poly(3-methylthiopropyl acrylate), poly(nonyl acrylate), poly(octyl acrylate), poly(2-octyl acrylate), poly(3-pentyl acrylate), poly(propyl acrylate), poly(hydroxyethyl acrylate), poly(hydroxypropyl acrylate), polyester acrylate, polybutyl acrylate, etc.

Polymethacrylates of 20° C. or lower in glass transition temperature include homopolymers such as poly(decyl methacrylate), poly(dodecyl methacrylate), poly(2-ethylhexyl methacrylate), poly(octadecyl methacrylate), poly(octyl methacrylate), poly(tetradecyl methacrylate), poly(n-hexyl methacrylate) and poly(lauryl methacrylate), and copolymers with acrylates.

(2) Unvulcanized Rubbers

Natural rubber (NR), and homopolymers and copolymers of butadiene, isoprene, styrene, acrylonitrile, acrylates and methacrylates, such as polybutadiene (BR), styrene-butadiene copolymer (SBR), carboxy modified styrene-butadiene copolymer, polyisoprene (NR), polyisobutylene, polychloroprene (CR), polyneoprene, acrylate-butadiene copolymers, methacrylate-butadiene copolymers, acrylate-acrylonitrile copolymers (ANM), isobutyrene-isoprene copolymer (IIR), acrylonitrile-butadiene copolymer (NBR), carboxy modified acrylonitrile-butadiene copolymer, acrylonitrile-chloroprene copolymer, acrylonitrile-isoprene copolymer, ethylene-propylene copolymer (EPM, EPDM), vinylpyridine-styrene-butadiene copolymer, styrene-isoprene copolymer, etc.

Furthermore, poly(1,3-butadiene, poly(2-chloro-1,3-butadiene), poly(2-decyl-1,3-butadiene), poly(2,3-dimethyl-1,3-butadiene), poly(2-ethyl-1,3-butadiene), poly(2-heptyl-1,3-butadiene), poly(2-isopropyl-1,3-butadiene), poly(2-methyl-1,3-butadiene), chlorosulfonated polyethylene, etc.

In addition, modified products of these rubbers, for example, rubbers usually modified by epoxylation, chlorination, or carboxylation, etc., and blends with other polymers can also be used as binder resins.

(3) Polyoxides (Polyethers)

Homopolymers, copolymers, etc. obtained by ring-opening polymerization of trioxan, ethylene oxide, propylene oxide, 2,3-epoxybutane, 3,4-epoxybutene, 2,3-epoxypentane, 1,2-epoxyhexane, epoxycyclohexane, epoxycycloheptane, epoxycyclooctane, styrene oxide, 2-phenyl-1,2-epoxypropane, tetramethylethylene oxide, epichlorohydrin, epibromohydrin, allyl glycidyl ether, phenyl glycidyl ether, n-butyl glycidyl ether, 1,4-dichloro-2,3-epoxybutane, 2,3-epoxypropionaldehyde, 2,3-epoxy-2-methylpropionaldehyde, 2,3-epoxydiethylacetal, etc.

Polyoxides of 20° C. or lower in glass transition temperature include, for example, polyacetaldehyde, poly(butadiene oxide), poly(1-butene oxide), poly(dodecene oxide), poly (ethylene oxide), poly(isobutene oxide), polyformaldehyde, poly(propylene oxide), poly(tetramethylene oxide), poly (trimethylene oxide), etc.

(4) Polyesters

Polyesters obtained by polycondensation of polyhydric alcohols and polycarboxylic acids enumerated below, polyesters obtained by polymerization of polyhydric alcohols and polycarboxylic anhydrides, polyesters obtained by ring-opening polymerization, etc. of lactones, polyesters obtained from the mixtures of these polyhydric alcohols, polycarboxylic acids, polycarboxylic anhydrides, and lactones, and so on.

Polyhydric alcohols include, for example, ethylene glycol, propylene glycol, 1,3-propanediol, 1,4-butanediol, 1,3-butylene glycol, 1,5-pentanediol, 1,6-hexanediol, diethylene glycol, dipropylene glycol, neopentyl glycol, triethylene glycol, p-xylene glycol, hydrogenated bisphenol A, bisphenol hydroxypropyl ether, glycerol, trimethylolethane, trimethylolpropane, trishydroxymethylaminomethane, pentaerythritol, dipentaerythritol, sorbitol, etc.

Polycarboxylic acids and polycarboxylic anhydrides include, for example, phthalic anhydride, isophthalic acid, terephthalic acid, succinic anhydride, adipic acid, azelaic acid, sebacic acid, tetrahydrophthalic anhydride, hexahydrophthalic anhydride, tetrabrmophthalic acid, tetrachlorophthalic anhydride, HET anhydride, himic anhydrid, maleic anhydride, fumaric acid, itaconic acid, trimellitic anhydride, methylcy-clohexenetricarboxylic anhydride, pyromellitic anhydride, etc.

Lactones include β-propiolactone, γ-butyrolactone, δ-valerolactone, ε-captrolactone, etc.

Polyesters of 20° C. or lower in glass transition temperature include, for example, poly[1,4-(2-butene) sebacate], [1,4-(2-butyne) sebacate], poly(decamethylene adipate), poly(ethylene adipate), poly(oxydiethylene adipate), poly (oxydiethylene azelate), poly(oxydiethylene dodecanediate), poly(oxydiethylene glutarate), poly (oxydiethylene heptylmalonate), poly(oxydiethylene nonylmalonate), poly(oxydiethylene octadecanediate), poly (oxydiethylene oxalate), poly(oxydiethylene pentylmalonate), poly(oxydiethylene pimelate), poly (oxydiethylene propylmalonate), poly(oxydiethylene sebacate), poly(oxydiethylene suberate), poly(oxyethylene succinate), poly(pentamethylene adipate), poly (tetramethylene adipate, poly(tetramethylene sebacate), poly(trimethylene adipate), etc.

(5) Polyurethanes

The polyurethanes obtained from the following polyisocyanates and polyhydric alcohols can also be used as binder resins. The polyhydric alcohols include the polyhydric alcohols enumerated above for the polyesters, the following polyhydric alcohols, polyester polyols with hydroxyl groups at both the ends obtained by polycondensation of these polyhydric alcohols and the polycarboxylic acids enumerated above for the polyesters, polyester polyols obtained from lactones, polycarbonate diols, polyether polyols obtained by ring-opening polymerization of propylene oxide and tetrahydrofuran and obtained by modification by epoxy resin, acrylic polyols as copolymers of (meth)acrylic monomers with a hydroxyl group and (meth)acrylates, polybutadiene polyol, etc.

Isocyanates include paraphenylene diisocyanate, 2,4- or 2,6-toluylene diisocyanate (TDI), 4,4-diphenylmethane diisocyanate (MDI), tolidine diisocyanate (TODI), xylylene diisocyanate (XDI), hydrogenated xylylene diisocyanate, cyclohexane diisocyanate, metaxylylene diisocyanate (MXDI), hexamethylene diisocyanate (HDI or HMDI), lysine diisocyanate (LDI) (also called 4,4'-methylenebis (cyclohexyl isocyanate)), hydrogenated TDI (HTDI) (also called methylcyclohexane 2,4(2,6)diisocyanate), hydrogenated XDI (H6XDI) (also called 1,3-(isocynanatomethyl) cyclohexane), isophorone diisocyanate (IPDI), diphenyl ether isocyanate, trimethylhexamethylene diisocyanate (TMDI), tetramethylxylylene diisocyanate, polymethylene-polyphenyl isocyanate, dimeric acid diisocyanate (DDI), triphenylmethane triisocyanate, tris(isocyanatophenyl) thiophosphate, tetramethylxylylene diisocyanate, lysin ester triisocyanate, 1,6,11-undecane triisocyanate, 1,8-diisocyanato-4-isocyanatomethyloctane, 1,3,6-hexamethylene, triisocyanate, bicycloheptane triisocyanate, etc., polyhydric alcohol adducts of polyisocyanates, polymers of polyisocyanates, etc.

Typical polyhydric alcohols other than those enumerated above for the polyesters include polypropylene glycol, polyethylene glycol, polytetramethylene glycol, ethylene oxide-propylene oxide copolymer, and tetrahydrofuran-propylene oxide copolymer. Polyester diols include polyethylene adipate, polypropylene adipate, polyhexamethylene adipate, polyneopentyl adipate, polyhexamethylene neopentyl adipate, polyethylene hexamethylene adipate, etc., and also poly-ϵ-caprolactone diol, polyhexamethylene carbonate diol, polytetramethylene adipate, sorbitol, methyglucocide, sucrose, etc.

Furthermore, various phosphorus-containing polyols, halogen-containing polyols, etc. can also be used as polyols.

The above isocyanates and polyols can be caused to react with each other by publicly known methods to obtain the intended polyurethanes, and these polyurethanes are generally 20° C. or lower in glass transition temperature and can be used in the present invention.

(6) Polyamides

Copolymers of the following monomers are included. The monomers are ϵ-caprolactam, ω-laurolactam, ω-aminoundecanoic acid, hexamethylenediamine, 4,4-bis-aminocyclohexylmethane, 2,4,4-trimethylhexamethylenediamine, isophoronediamine, glycols, isophthalic acid, adipic acid, sebacic acid, dodecanoic diacid, etc.

To describe in more detail, polyamides can be classified into two major categories; water soluble polyamides and alcohol soluble polyamides. The water soluble polyamides include polyamides containing sulfonic acid groups or sulfonate groups obtained by copolymerizing sodium 3,5-dicarboxybenzenesulfonate as stated in JP-A-48-72250; polyamides with ether bonds obtained by copolymerizing at least one of dicarboxylic acids, diamines and cyclic amides with an ether bond in the molecule as stated in JP-A-49-43465, polyamides containing basic nitrogen obtained by copolymerizing N,N'-di(γ-aminopropyl)piperazine, etc. and polyamides obtained by making those polyamides quaternary by acrylic acid, etc. as stated in Japanese Patent Laid-Open (Kokai) 50-7605, copolymerized polyamides containing a polyether segment of 150 to 1500 in molecular weight proposed in JP-A-55-74537, polyamides obtained by ring-opening polymerization of an α((N,N'-dialkylamino)-ϵ-caprolactam or ring-opening copolymerization of an α-(N, N'-dialkylamino)-ϵ-caprolactam and ϵ-caprolactam, and so on.

The alcohol soluble polyamides are linear polyamides synthesized from a dibasic fatty acid and a diamine, ω-amino acid, lactam or any of their derivatives by any publicly known method, and homopolymers, copolymers, block polymers, etc. can be used. Typical ones are nylon 3, 4, 5, 6, 8, 11, 12, 13, 66, 610, 6/10, 13/13, polyamide obtained from metaxylylenediamine and adipic acid, polyamide obtained from trimethylhexamethylenediamine or isophoronediamine and adipic acid, ϵ-caprolactam/adipic acid/hexamethylenediamine/4,4'-diaminodicyclohexylmethane copolymerized polyamide, ϵ-caprolactam/adipic acid/hexamethylenediamine/2,4,4'-trimethylhexamethylenediamine copolymerized polyamide, ϵ-caprolactam/adipic acid/hexamethylenediamine/isophoronediamine copolymerized polyamide, polyamides containing these components. Their N-methylol or N-alkoxymethyl derivatives can also be used.

One or more as a mixture of the above polyamides can be used for the heating insulating layer and the heat sensitive layer of the present invention.

Polyamides of 20° C. or lower in glass transition temperature include copolymerized polyamides containing a polyether segment of 150 to 1500 in molecular weight, more concretely, a copolymerized polyamide with amino groups at the ends, containing 30 to 70 wt % of polyoxyethylene and an aliphatic dicarboxylic acid or diamine as components, of 150 to 1500 in the molecular weight of the polyether segment portion.

One or more as a mixture of the above binder resins can be used.

Among the above polymers, those preferably used for the heat insulating layer and the heat sensitive layer of the present invention are polyurethanes, polyesters, vinyl based polymers, and unvulcanized rubbers.

The amount of any binder resin used is preferably 20 to 70 wt %, more preferably 15 to 50 wt % based on the weight of the ingredients of the heat insulating layer or the heat sensitive layer.

The binder resin can be used as unvulcanized, but to obtain practical solvent resistance for the step of printing, it is preferably treated to form a crosslinked structure by a crosslinking agent.

The crosslinking agents which can be used in the heat insulating layer and the heat sensitive layer of the present invention include the following:

(1) Isocyanates

Isocyanates enumerated above for the polyurethanes.

(2) Polyfunctional Epoxy Compounds

Polyethylene glycol diglycidyl ethers, polypropylene glycol diglycidyl ethers; bisphenol A diglycidyl ethers, trimethylolpropane triglycidyl ether, pentaerythritol tetraglycidyl ether, etc.

(3) Polyfunctional Acrylate Compounds, etc.

The anchoring agent as a component of the heat insulating layer and the heat sensitive layer can be, for example, any publicly known adhesive such as a silane coupling agent, and an organic titanate, etc. can also be used effectively.

For improving coatability, a surfactant can also be added as desired.

Since the imaged area of the printing plate becomes the image area after the heat insulating layer is exposed, it is preferable to let the heat insulating layer contain an additive such as a dye for improving plate inspectability.

The compositions for forming the heat insulating layer and the heat sensitive layer are prepared as solutions, by dissolving them into any proper organic solvent such as DMF, methyl ethyl ketone, methyl isobutyl ketone, dioxane, toluene, xylene or THF. The composition solutions are uniformly applied onto a substrate and heated at a necessary temperature for a necessary time, to form the heat insulating layer and the heat sensitive layer.

The thickness of the heat insulating layer is preferably 0.5 to 50 $g/m^2$, more preferably 2 to 7 $g/m^2$. If the thickness is thinner than 0.5 $g/m^2$, the effect to prevent the shape defects and chemical adverse influence on the surface of the substrate is poor, and if thicker than 50 $g/m^2$, an economical disadvantage is inevitable.

The thickness of the heat sensitive layer is preferably 0.2 to 3 $g/m^2$, more preferably 0.5 to 2 $g/m^2$. If the thickness is thinner than 0.2 $g/m^2$, coating is technically difficult, and if thicker than 3 $g/m^2$, decomposability becomes very low when an image is formed by irradiation with a laser beam.

The heat sensitive layer used in the present invention is described below in more detail. It is important that the heat sensitive layer efficiently absorbs the laser beam, and is instantaneously partially or wholly decomposed by the heat.

So, it is preferable to let the heat sensitive layer contain a light-heat converting material and a self oxidizing material.

The light-heat converting material is not especially limited as far as it can absorb light for converting it into heat, and can be selected, for example, from black pigments such as carbon black, aniline black and cyanine black, green pigments based on phthalocyanine or naphthalocyanine, carbon graphite, iron powder, diamine based metal complexes, dithiol based metal complexes, phenolthiol based metal complexes, mercaptophenol based metal complexes, arylaluminum metal salts, crystal water-containing inorganic compounds, copper sulfate, chromium sulfide, silicate compounds, metal oxides such as titanium oxide, vanadium oxide, manganese oxide, iron oxide, cobalt oxide and tungsten oxide, hydroxides and sulfates of these metals, and metallic powders of bismuth, tin, tellurium, iron and aluminum.

Among them, in view of light-heat conversion rate, economy and handling convenience, carbon black is especially preferable.

Carbon black can be classified, in reference to production methods, into furnace black, channel black, thermal black, acetylene black, lamp black, etc., and among them, furnace black can be preferably used since it is marketed as various types in view of grain size, etc., and is commercially inexpensive.

Marketed carbon black is available in various grain sizes, and the average grain size of primary grains is preferably 15 to 29 nm, more preferably 17 to 26 nm.

If the average grain size of primary grains is smaller than 15 nm, the heat sensitive layer itself tends to be transparent, and cannot efficiently absorb the laser beam, and if larger than 29 nm, the grains cannot be dispersed at a high density, not allowing the blackness of the heat sensitive layer to be intensified, hence not allowing efficient absorption of the laser beam. This finally brings about a problem that the sensitivity of the printing plate declines.

The primary grain size of carbon black can be measured by the settlement method, microscope method, transmission method, adsorption method, X-ray method, etc. Among them, the use of an electron microscope or X-ray method is preferable. For the X-ray method, an X-ray generator produced by Rigaku Denki, etc. can be used.

For measurement in the state of a printing plate, the plate can be cut into a thin film, and the primary grain size of carbon black can be measured using a transmissive electron microscope.

The oil absorption of carbon black also affects the sensitivity of the printing plate and the viscosity of the solution destined to be the heat sensitive layer.

The oil absorption indicates the structure of carbon black, i.e., the degree of cohesion of grains. If the oil absorption is larger, the grains cohere more greatly, and if the oil absorption decreases, the grains cohere less.

In the heat sensitive layer of the present invention, the oil absorption is preferably 50 ml/100 g to 100 ml/100 g, more preferably 60 ml/100 g to 90 ml/100 g.

If the oil absorption is smaller than 50 ml/100 g, the dispersibility of carbon black declines and the sensitivity of the printing plate is likely to decline. If the oil absorption is larger than 100 ml/100 g, the composition solution becomes high in viscosity and becomes thixotropic and difficult to handle.

The oil absorption refers to the oil absorption in DBP (dibutyl phthalate) specified in ASTM D 2414-70. For measuring the oil absorption, while dibutyl phthalate is added dropwise to 100 g of powdery carbon black, they are kneaded by a spatula, etc., and the amount (ml) of dibutyl phthalate added when the mixture of carbon black and dibutyl phthalate has become pasty is used as an indicator of the oil absorption of carbon black.

The use of electrically conductive carbon black is also effective for enhancing the sensitivity of the plate.

The electric conductivity is preferably in a range of 0.01 to 100 $\Omega^{-1}$ $cm^{-1}$, more preferably 0.1 to 10 $\Omega^{-1}$ $cm^{-1}$.

Specifically “CONDUCTEX” 40-220, “CONDUCTEX” 975 BEADS, “CONDUCTEX” 900 BEADS, “CONDUCTEX” SC, “BATTERY BLACK” (produced by Columbian Carbon Nippon), #3000 (produced by Mitsubishi Kasei Corp.), etc. can be preferably used.

It is important that the heat sensitive layer is instantaneously partially or wholly decomposed by the heat generated by the light-heat converting material. To satisfy the thermal decomposability, it is important to also add a self oxidizing material. Preferable self oxidizing materials include nitro compounds such as ammonium nitrate, potassium nitrate, sodium nitrate and nitrocellulose, organic peroxides, azo compounds, diazo compounds and hydrazine derivatives.

Among them, nitrocellulose has a moderate viscosity as a solution since it is a high polymer, and furthermore since it has hydroxyl groups in the molecule, it is especially preferably likely to form a crosslinked structure in the heat sensitive layer.

One of the features of nitrocellulose is that various molecular-weights can be selected to suit respective purposes. The nitrocellulose in this case is not that for explosives, but is preferably that for industrial use.

The viscosity of nitrocellulose can be measured according to the method specified in ASTM D 301-72. It is important that the nitrocellulose used in the present invention is 1/16 seconds to 3 seconds, preferably 1/8 second to 1 second, more preferably ⅛ second to ½ second in the specified viscosity. If the viscosity is less than 1/16, the printing durability of the printing plate is likely to decline since the nitrocellulose is too low in polymerization degree. If more than 1 second, the viscosity is so high as to inconvenience handling, and the coatability in producing the printing plate declines unpreferably.

The nitrogen content of nitrocellulose also greatly affects the performance of the printing plate.

Nitrocellulose is a straight chain high polymer, and has a structure in which D-glucose as a component of it has 3 hydroxyl groups at the maximum. The nitrogen content is specified by the substitution degree of the hydroxyl groups by nitro groups.

The nitrogen content refers to a rate of the atomic weight of nitrogen to the molecular weight of nitrocellulose and indicates the degree of nitration. A higher nitrogen content means a higher nitration degree.

The nitrogen content can be obtained from the following formula. It can also be obtained by elementary analysis.

If weight of product (nitrocellulose)/weight of raw material (cellulose) is x, then Nitrogen content (%)=$31.1\times(1-1/x)$ If all the three hydroxyl groups of D-glucose are substituted by nitro groups, the nitrogen content is 14.1%, and if only one is substituted by a nitro group, the nitrogen content is 6.8%.

That is, when the nitrogen content is larger, the number of hydroxyl groups in the molecule is smaller, and it tends to be difficult to form a crosslinked structure in the heat sensitive layer.

So, the nitrocellulose used in the present invention is preferably 11.5% or less, more preferably 6.8% to 11.5%.

If the nitrogen content is smaller than 6.8%, the sensitivity of the printing plate declines, and the solubility in the solvent is also likely to decline. If larger than 11.5%, the number of hydroxyl groups is so small as to make it difficult to form a crosslinked structure in the heat sensitive layer, and as a result, printing durability declines unpreferably.

Since this nitrocellulose is used in combination with carbon black, the ratio is very important.

If the amount of carbon black added is too large or too small against nitrocellulose, no proper printing plate can be obtained.

It is important that the ratio by weight is 1.1 or more of carbon black to 1 of nitrocellulose. If the ratio by weight of carbon black is less than 1.1, the laser beam cannot be efficiently absorbed, to lower the sensitivity of the printing plate. The sum of the weights of carbon black and nitrocellulose is preferably 30 to 90 wt %, more preferably 40 to 70 wt % based on the weight of the entire composition of the heat sensitive layer. If the amount is smaller than 30 wt %, the sensitivity of the printing plate declines, and if larger than 90 wt %, the solvent resistance of the printing plate is likely to decline.

It is also very effective to add a thermal decomposition aid such as urea, urea derivative, zinc dust, lead carbonate, lead stearate or glycollic acid. The amount of the thermal decomposition aid added is preferably 0.02 to 10 wt %, more preferably 0.1 to 5 wt % based on the weight of the entire composition of the heat sensitive layer.

In addition to the above materials, a dye to absorb infrared rays or near infrared rays can also be preferably used as a light-heat converting material.

As the dye, all the dyes with the maximum absorption wavelength in a range of 400 nm to 1200 nm can be used. Preferable dyes include acid dyes, basic dyes, pigments and oil soluble dyes for electronics and recording, based on cyanine, phthalocyanine, phtalocyanine metal complex, naphthalocyanine, naphthalocyanine metal complex, dithiol metal complex, naphthoquinone, anthraquinone, indophenol, indoaniline, pyrylium, thiopyrylium, squalilium, croconium, diphenylmethane, triphenylmethane, triphenylmethane phthalide, triallylmethane, phenothiazine, phenoxazine, fluoran, thiofluoran, xanthene, indolylphthalide, spiropyran, azaphthalide, chromenopyrazole, leucoauramine, rhodaminelactam, quinazoline, diazaxanthene, bislactone, fluorenone, monoazo, ketoneimine, disazo, methine, oxazine, nigrosine, bisazo, bisazostilbene, bisazooxaziazole, bisazofluorenone, bisazohydroxyperinone, azochromium complex salt, trisazotriphenylamine, thioindigo, perylene, nitroso, 1:2 type metal complex salt, intermolecular CT, quinoline, quinophthalone and flugide, and also triphenylmethane based leuco pigments, cationic dyes, azo based disperse dyes, benzothiopyran based spiropyran, 3,9-dibromoanthoanthrone, idanthrone, phenolphthalein, sulfophthalein, ethyl violet, methyl orange, fluorescein, methylviologen, methylene blue, dibromobetaine, etc.

Among them, preferably used are dyes for electronics and recording of 700 nm to 900 nm in maximum absorption wavelength such as cyanine dyes, azlenium dyes, squalilium dyes, croconium dyes, azo disperse dyes, bisazostilbene dyes, naphthoquinone dyes, anthraquinone dyes, perylene dyes, phthalocyanine dyes, naphthalocyanine metal complex dyes, dithiolnickel complex dyes, indoaniline metal complex dyes, intermolecular CT dyes, benzothiopyran based spyropyran, and black dyes like nigrosine dyes.

Among these dyes, those large in molar absorption coefficient can be preferably used. Specifically, $\epsilon=1\times10^4$ or more is preferable, and $1\times10^5$ or more is more preferable. If E is smaller than $1\times10^4$, the effect of improving sensitivity is hard to obtain.

The heat sensitive layer must have a crosslinked structure to achieve high solvent resistance against printing ink. The crosslinking method can be either thermal crosslinking or photo crosslinking. In the present invention, since the heat sensitive layer is low in light transmittance, photo crosslinking does not allow sufficient reaction to occur. So, thermal crosslinking is preferable.

The polyfunctional crosslinking agents which can be used here to introduce the crosslinked structure include combinations between a polyfunctional isocyanate based compound or polyfunctional epoxy compound and a urea based compound, amine based compound, hydroxyl group-containing compound, carboxylic acid compound or thiol based compound. However, if a polyfunctional isocyanate based compound is used, curing at a high temperature is necessary since the reaction is not completed in a short time, but since the decomposition temperature of nitrocellulose is 180° C., curing at a temperature higher than it cannot be executed. So, the reaction may gradually occur also after production of printing plate, to adversely affect the developability of the printing plate. Therefore, for crosslinking, a combination between a polyfunction epoxy compound and an amine based compound, amide based compound, hydroxyl group-containing compound, carboxylic acid compound or thiol based compound is preferable.

The polyfunctional epoxy compounds which can be used here include bisphenol A type epoxy resin, bisphenol F type epoxy resin, and glycidyl ether type epoxy resin.

The amine based compounds which can be used here include butylated urea resin, butylated melamine resin, butylated benzoguanamine resin, butylated urea melamine co-condensation resin, aminoalkyd resin, iso-butylated melamine resin, methylated melamine resin, hexamethoxymethlolmelamine, methylated benzoguanamine resin, butylated benzoguanamine resin, diethylenetriamine, triethylenetriamine, tetraethylenepentamine, diethylaminopropylamine, N-aminoethylpiperazine, metaxylylenediamine, metaphenylenediamine, diaminodiphenylmethane, diaminodiphenylsulfone, isophoronediamine, etc.

The amide based compounds which can be used here include polyamide based hardening agents, dicyandiamide, etc. used as hardening agents of epoxy resin, and the hydroxyl group-containing compounds which can be used here include phenol resin, polyhydric alcohols, etc. The thio based compounds which can be used here include polythiols, etc.

The carboxylic acid compounds which can be preferably used here include phthalic acid, hexahydrophthalic acid, tetrahydrophthalic acid, dodecylsuccinic acid, pyromellitic acid, crotonic acid, maleic acid, fumaric acid, and their anhydrides.

In these cases, it is preferable to use a publicly known catalyst such as a quaternary ammonium salt, KOH, $SnCl_4$, $Zn(BF_4)_2$, or imidazole compound, etc. as a catalyst for promoting the reaction.

Among the above crosslinking agents, a combination between a polyfunctional epoxy compound and an amine based compound is more preferable in view of hardening rate and handling convenience.

Furthermore, a polyfunctional crosslinking agent with an organic silyl group, or amino group-containing monomer can also be preferably used.

The amount of the polyfunctional crosslinking agent used is preferably 1 to 50 wt %, more preferably 3 to 40 wt % based on the weight of the entire composition of the heat sensitive layer. If the amount is smaller than 1 wt %, the solvent resistance of the printing plate is likely to decline, and if larger than 50 wt %, the printing plate becomes hard and is likely to decline in printing durability.

The heat sensitive layer can preferably contain a binder resin for the purpose of improving the storage stability, and the resins which can used in this case include the resins used for the heat insulating layer, such as polyurethane resin, phenol resin, acrylic resin, alkyd resin, polyester resin, vinyl chloride-vinyl acetate copolymer, vinyl chloride resin, polyvinyl butyral resin, ethylene-vinyl acetate copolymer, polycarbonate resin, polyacrylonitrile-butadiene copolymer, polyether resin, polyether sulfone resin, milk casein, gelatin, cellulose derivatives such as carboxymethyl cellulose, cellulose acetate, cellulose propyl acetate, cellulose butyl acetate, cellulose triacetate, hydroxypropyl cellulose ether, ethyl cellulose ether and cellulose phosphate, polyvinyl acetate, polystyrene, polystyrene-acrylonitrile copolymer, polysulfone, polyphenylene oxide, polyethylene oxide, polyvinyl alcohol-acetal copolymer, polyvinyl acetal, polyvinyl alcohol-polyacetal copolymer, polyvinyl alcohol-polybutyral copolymer, polyvinyl benzal, polyvinyl alcohol, ethylene maleic anhydride copolymer, chlorinated polyolefins such as chlorinated polyethylene and chlorinated polypropylene, etc. Among them, cellulose derivatives such as cellulose acetate, chlorine-containing, copolymers such as polyvinyl chloride-vinyl acetate copolymer, ethylene-vinyl acetate copolymer, polyurethane resin and acrylic resin can be preferably used.

In addition to the above thermally decomposable compounds, polyacetylene, polyaniline, etc. known as electrically conductive polymers can also be preferably used.

Furthermore, the heat sensitive layer can also contain such additives as antiseptic, antihalation dye, defoaming agent, antistatic agent, dispersing agent, emulsifier and surfactant.

It is especially preferable to add a fluorine based surfactant to improve coatability. The amounts of these additives are usually 10 wt % or less based on the weight of the entire composition of the heat sensitive layer.

If an addition type silicone rubber is used for the silicone rubber layer, a compound with ethylenic unsaturated double bonds can be added for improving the adhesiveness between the heat sensitive layer and the silicone rubber layer. The compounds with ethylenic unsaturated double bonds which can be used here include the following compounds, and especially epoxy acrylates are especially preferable. The amount of the compound with ethylenic unsaturated double bonds is preferably 0.5 to 30 wt % based on the weight of the entire composition of the heat sensitive layer. (1) Esterification products between a polyfunctional hydroxyl group-containing, compound and acrylic acid or methacrylic acid.

The polyfunctional hydroxyl group-containing compounds which can be used here include ethylene glycol, diethylene glycol, polyethylene glycol, propylene glycol, dipropylene glycol, polypropylene glycol, 1,3-butanediol, 1,6-hexanediol, 1,8-octanediol, 1,9-nonanediol, hydroquinone, dihydorxyanthraquinone, bisphenol A, bisphenol S, resol resin, pyrogallolacetone resin, hydroxystyrene copolymers, glycerol, pentaerythritol, dipentaerythritol, trimethylolpropane, polyvinyl alcohol, cellulose, cellulose derivatives, and homopolymers and copolymers of hydroxyacrylates and hydroxymethacrylates. Any of these polyfunctional hydroxyl group-containing compounds and acrylic acid or methacrylic acid can be esterified by any publicly known reaction method, to obtain the intended compound. In this case, it is necessary to execute the reaction at a ratio to let one molecule contain two or more ethylenic unsaturated groups.

(2) Epoxy acrylates obtained by letting an epoxy compound and acrylic acid, methacrylic acid, glycidyl acrylate or glycidyl methacrylate react with each other.

The epoxy compounds which can be used here include the compounds obtained by letting an epihalohydrin react with any of the hydroxyl group-containing compounds enumerated in the above (1).

Those with ethylene oxide or propylene oxide added to the hydroxyl group of any of the above hydroxy group-containing compounds can also be similarly used.

Any of these epoxy compounds can be caused to react with acrylic acid, methacrylic acid, glycidyl acrylate or glycidyl methacrylate by any publicly known method, to obtain the intended epoxy acrylate.

(3) Compounds obtained by letting an amine compound and glycidyl acrylate, glycidyl methacrylate, acrylic acid chloride or methacrylic acid chloride react with each other.

The amine compounds which can be used here include monovalent amine compounds such as octylamine and laurylamine, aliphatic polyamine compounds such as dioxyethylenediamine, trioxyethylenediamine, tetraoxyethylenediamine, pentaoxyethylenediamine, hexaoxyethylenediamine, heptaoxyethylenediamine, octaoxyethylenediamine, nonaoxyethylenediamine, monoxypropylenediamine, dioxypropylenediamine, trioxypropylenediamine, tetraoxypropylenediamine, pentaoxypropylenediamine, hexaoxypropylenediamine, heptaoxypropylenediamine, octaoxypropylenediamine, nonaoxypropylenediamine, polymethylenediamine, polyetherdiamine, diethylenetriamine, triethylenetetramine and tetraethylpentamine, and polyamine compounds such as m-xylylenediamine, p-xylylenediamine, m-phenylenediamine, diaminodiphenyl ether, benzidine, 4,4'-bis(o-toluidine), 4,4'-thiodianiline, o-phenylenediamine, dianisidine, 4-chloro-o-phenylenediamine, and 4-methoxy-6-methyl-m-phenylenediamine. Any of these amine compounds can be caused to react with glycidyl acrylate, glycidyl methacrylate, acrylic acid chloride or methacrylic acid chloride by any publicly known method, to obtain the intended compound.

(4) Compounds obtained by letting a compound with a carboxyl group and glycidy]l acrylate or glycidyl methacrylate react with each other.

The carboxyl group-containing compounds which can be used here include malonic acid, succinic acid, malic acid, thiomalic acid, racemic acid, citric acid, glutaric acid, adipic acid, pimelic acid, suberic acid, azelaic acid, sebacic acid, maleic acid, fumaric acid, itaconic acid, dimeric acid, trimellitic acid, carboxy modified unvulcanized rubber, etc.

Any of these compounds with a carboxyl group can be caused to react with glycidyl acrylate or glycidyl methacrylate by any publicly known method, to obtain the intended compound.

(5) Urethane Acrylates

Glycerol diacrylate isophorone diisocyanate urethane prepolymer, pentaerythritol triacrylate hexamethylene diisocyanate urethane prepolymer, etc.

One or more as a mixture of the above compounds with two or more ethylenic unsaturated double bonds in one molecule can be used.

As the case may be, to improve the adhesiveness with the addition type silicone rubber layer laminated above, silica powder or hydrophobic silica powder with its grain surfaces treated by a silane coupling agent containing a (meth) acryloyl group or allyl group can be added by 20 wt % or less based on the weight of the entire composition of the heat sensitive layer. The composition to form the above heat sensitive layer is dissolved into a proper organic solvent such as DMF, methyl ethyl ketone, methyl isobutyl ketone, dioxane, toluene, xylene, ethyl acetate, butyl acetate, isobutyl acetate, isoamyl acetate, methyl propionate, ethylene glycol monomethyl ether, ethylene glycol dimethyl ether, ethylene glycol monoethyl ether, ethylene glycol diethyl ether, acetone, methyl alcohol, ethyl alcohol, cyclopentanol, cyclohexanol, diacetone alcohol, benzyl alcohol, butyl butyrate or ethyl lactate, to prepare a composition solution. The composition solution is uniformly applied onto a substrate, and heated at a necessary temperature for a necessary time, to form the heat sensitive layer.

Its thermosetting must be executed in a temperature range not to decompose the thermally decomposable nitrocellulose, usually at 180° C. or lower, and because of this, it is preferable to use any of the above enumerated catalysts together.

The directly imageable raw plate for waterless planographic printing plate is finally developed, to remove the heat sensitive layer and the silicone rubber layer simultaneously at the laser exposed area, for forming an inking area. Development can be executed using water or a liquid with water as the main component. In this case, the heat sensitive layer must be perfectly removed. Since the heat sensitive layer also has ink deposited, the remaining heat sensitive layer does not affect the performance of the plate itself, but it makes it difficult to visually confirm the pattern, i.e., lowers the plate inspectability disadvantageously. So, in the present invention, if the heat sensitive layer contains a material which can be dissolved in or swollen by water, the directly imageable raw plate for waterless planographic printing plate obtained can be improved in developability and excellent in plate inspectability. The material to be added into the heat sensitive layer to achieve this purpose is not especially limited as far as it is well dispersed in the composition of the heat sensitive layer, but a salt, monomer, oligomer or resin, etc. can be preferably used. The materials which can be dissolved in or swollen by water are enumerated below, but the present invention is not limited thereto or thereby.

(1) Natural Proteins

At least one protein selected from casein, gelatin, soybean protein, albumin, etc. More specifically, they include milk casein, acid casein, rennet casein, ammonia casein, potassium casein, borax casein, glue, gelatin, gluten, soybean lecithin, soybean protein, collagen, etc.

(2) Alginates

Ammonium alginate, potassium alginate, sodium alginate, etc.

(3) Starch, etc.

Starch alone and graft polymers of starch and a synthetic monomer such as acrylic acid.

(4) Cellulose, etc.

Cellulose alone and graft polymers of cellulose and a synthetic monomer such as acrylic acid. More specifically, they include carboxylated methyl cellulose, methyl cellulose, hydroxypropylmethyl cellulose, hydroxyethyl cellulose, cellulose xanthogenate, etc.

(5) Hyaluronic acid, etc.

Polymers such as natural polysaccharides as disclosed in JP-B-61-8083, Japanese Patent Laid-Open (Kokai) Nos. 58-56692, 60-49797, etc.

(6) Polyvinyl Alcohol, etc.

Polyvinyl alcohol alone, ketonation product of methyl acrylate-vinyl acetate copolymer, vinyl pyrrolidone based copolymers, etc.

(7) Acrylates, etc.

Monomers, polymers and crosslinked products of $\alpha$,$\beta$-unsaturated compounds with one or more groups such as carboxyl groups, carboxylic acid groups, carboxylates, carboxylic acid amides, carboxylic acid imides and carboxylic anhydrides in the molecule.

Said $\alpha$,$\beta$-unsaturated compounds include acrylic acid, methacrylic acid, acrylic acid amide, methacrylic acid amide, maleic anhydride, maleic acid, maleic acid amide, maleic acid imide, itaconic acid, crotonic acid, fumaric acid, mesaconic acid, etc. Any of these monomers can be radical-polymerized by any publicly known method, to obtain the intended homopolymer or copolymer. The homopolymer or copolymer can be caused to react with a compound like the hydroxide, oxide or carbonate, etc. of an alkali metal or alkaline earth metal, ammonia or amine, etc., to be enhanced in hydrophilicity.

(8) Hydrophilic Epoxy Compounds

Sorbitol polyglycidyl ether, sorbitan polyglycidyl ether, polyglycerol polyglycidyl ether, pentaerythritol polyglycidyl ether, diglycerol polyglycidyl ether, triglycidyl tris(2-hydroxyethyl) isocyanurate, glycerol polyglycidyl ether, trimethylolpropane polyglycidyl ether, neopentyl glycol diglycidyl ether, ethylene glycol diglycidyl ether, propylene glycol diglycidyl ether, polypropylene glycol diglycidyl ether, phenol ethylene oxide added glycidyl ether, lauryl alcohol ethylene oxide added glycidyl ether, adipic acid diglycidyl ester, etc.

(9) Water Soluble Acrylates, etc.

Ethylene glycol diacrylate, ethylene glycol dimethacrylate, diethylene glycol diacrylate, diethylene glycol dimethacrylate, polyethylene glycol diacrylate, polyethylene glycol dimethacrylate, propylene glycol diacrylate, propylene glycol dimethacrylate, dipropylene glycol diacrylate, dipropylene glycol dimethacrylate, polypropylene glycol diacrylate, polypropylene glycol dimethacrylate, reaction product of p-xylylenediamine and glycidyl methacrylate, etc.

Among the above materials which can be dissolved in or swollen by water, salts include reaction products between a material of (2), (6) or (7) and an alkaline earth metal. Monomers and oligomers include materials of (2), (7), (8) and (9). Resins include the materials of (1), (3), (4), (5), (6) and (7).

Among these hydrophilic compounds, especially resins, and crosslinkabLe monomers, oligomers and resins can also be used as binders, and are economically preferable since it is not necessary to let the heat sensitive layer contain another binder.

The amount of the hydrophilic compound added to the heat sensitive layer is preferably 10 to 40 wt %. If the amount is smaller than 10 wt %, the intended effect of improving developability cannot be obtained, and if larger than 40 wt %, the heat sensitive layer is unpreferably likely to be swollen and removed at the non-exposed area which should remain after completion of development.

The apparatuses used to form the heat insulating layer, heat sensitive layer and silicone rubber layer include a slit die coater, direct gravure coater, offset gravure coater, reverse roll coater, natural roll coater, air knife coater, roll blade coater, vari-bar roll blade coater, two-stream coater, rod coater, dip coater, curtain coater, etc. In view of film accuracy, productivity and cost, a slit die coater, gravure coater and roll coater are especially preferable.

The directly imageable waterless planographic printing plate can be prepared by coating with the above mentioned respective layers, or by forming the heat sensitive layer by vapor deposition or sputtering as described below in detail.

The optical density in this specification refers to the value measured by Macbeth densitometer RD-514 using Wratten filter No. 106.

It is important that the heat sensitive layer used in the present invention efficiently absorbs the laser beam and is instantaneously partially or wholly evaporated or fused by its heat.

For efficient absorption of laser beam, the absorption rate at the wavelength (about 800 nm) of the semiconductor laser used as a light source is important.

As an indicator of the absorption rate for the light of about 800 nm, the optical density of the heat sensitive layer is measured. If the optical density is higher, the laser beam can be more efficiently absorbed. The optical density is preferably 0.6 to 2.3, more preferably 0.8 to 2.0. If the optical density is lower than 0.6, the laser beam cannot be efficiently absorbed, and as a result, the sensitivity of the printing plate is likely to decline. If higher than 2.3, the film thickness becomes so thick as to require, extra energy for forming the image, and the sensitivity declines.

In view of the sensitivity of the printing plate, the melting point of the metal is very important. If the melting point is too high, the metal is not molten or evaporated even by irradiation with a laser beam. Specifically, any metal of 657° C. or lower in melting point can be used.

Such metals include tellurium, tin, antimony, gallium, magnesium, polonium, selenium, thallium, zinc, bismuth, etc.

If two or three of these metals are used as an alloy, the melting point is likely to decline especially preferable for improving the sensitivity of the printing plate.

These metals can be preferably used since if any of them is vapor-deposited to form a film, a pattern can be easily formed by a laser beam. However, if the melting point is too low, the shape retainability of the printing plate is likely to decline. An especially preferable range of melting points is 227 to 657° C.

Such metals include tellurium, tin, antimony, magnesium, polonium, thallium, zinc, bismuth, etc.

Furthermore, if two or three of these metals are used as an alloy, the melting point can be easily lowered, and the sensitivity as the printing plate is enhanced very preferably.

Various alloys can be prepared by combining metals, and all the possible combinations of the above enumerated metals of 657° C. or less in melting point can be used. Among them, in view of handling convenience, it is preferable to use two or three metals of tellurium, tin, antimony, gallium, bismuth and zinc in combination.

As for specific combinations, preferable alloys of two metals are tellurium/tin, tellurium/antimony, tellurium/gallium, tellurium/bismuth, tellurium/zinc, tin/antimony, tin/gallium, tin/bismuth and tin/zinc, more preferable two-metal alloys are tellurium/tin, tellurium/antimony, tellurium/zinc, tin/antimony and tin/zinc.

These alloys are good in shape retainability and are lower than 657° C. in melting point, to especially preferably improve the sensitivity.

Preferable alloys of three metals are tellurium/tin/antimony, tellurium/tin/gallium, tellurium/tin/bismuth, tellurium/tin/zinc, tellurium/zinc/antimony, tellurium/zinc/gallium, tellurium/zinc/bismuth and tin/zinc/antimony, more preferable three-metal alloys are tellurium/tin/antimony, tellurium/tin/zinc and tin/zinc/antimony.

These alloys are also good in shape retainability and are lower than 657° C. in melting point, to especially preferably improve the sensitivity.

To keep the optical density in said range, it is also very important to form the heat sensitive layer by laminating a thin carbon film and a thin metal film. As for the order of lamination, it is preferable to form the thin carbon film on the thin metal film since the effect of improving the sensitivity is larger. The metal used in this case is preferably 1727° C. or lower, more preferably 727° C. or lower in melting point. If the melting point is higher than 1727° C., the image is hard to form even if carbon is simultaneously vapor-deposited or sputtered.

Specifically preferable metals are titanium, aluminum, nickel, iron, chromium, tellurium, tin, antimony, gallium, magnesium, polonium, selenium, thallium, zinc and bismuth, and among them, tellurium, tin, antimony, gallium, bismuth and zinc are more preferable.

Any of these metals can be easily evaporated or molten by heat when the thin film is irradiated with a laser beam.

Two or more of the above metals can be used as an alloy to further lower the melting point, for improving the sensitivity as a printing plate.

Specifically, preferable alloys are tellurium/tin, tellurium/antimony, tellurium/gallium, tellurium/bismuth and tellurium/zinc. More preferable alloys are tellurium/zinc and tellurium/tin.

Preferable alloys of three metals are tellurium/tin/zinc, tellurium/gallium/zinc, tin/antimony/zinc and tin/bismuth/zinc. More preferable three-metal alloys are tellurium/tin/zinc and tin/bismuth/zinc.

These alloys are especially preferable since they are high in optical density and low in melting point.

The thickness of the thin metal film is preferably 50 to 500 Å, more preferably 100 to 300 Å.

It is important to form a thin carbon film on or under the thin metal film.

In this case, the thin carbon film must be black enough to inhibit the reflection from the thin metal film.

For this purpose, the thickness of the thin carbon film is preferably 50 to 500 Å, more preferably 100 to 300 Å.

The thickness ratio of the thin metal film and the thin carbon film also affects the sensitivity of the printing plate.

Specifically, the thickness of the thin carbon film is preferably ¼ to 6 when the thickness of the thin metal film is 1.

If the thickness ratio of the thin carbon film to the thin metal film is smaller than ¼, the effect of improving the sensitivity cannot be obtained, and if larger than 6, it is likely to be difficult to form the thin carbon film.

In this case, the entire thickness of the heat sensitive layer also greatly affects the sensitivity of the plate.

If the thickness is too thick, the energy required for evaporating or melting the thin films becomes excessive to lower the sensitivity of the plate.

So, the thickness of the heat sensitive layer as a whole is preferably 1000 Å or less, more preferably 300 Å or less.

The thin films can be preferably formed by vacuum evaporation or sputtering. For vacuum evaporation, in general, the metal and carbon are heated and evaporated in a reduced pressure vessel of $10^{-4}$ to $10^{-7}$ mm Hg, to form the thin films on the surface of the substrate.

For sputtering, a DC or AC voltage is applied across a pair of electrodes in a reduced pressure vessel of $10^{-1}$ to $10^{-3}$ mm Hg, to cause glow discharge, and the sputtering at the cathode is used to form the thin films on the substrate.

To enhance the adhesiveness between the heat sensitive layer and the silicone rubber layer, it is also important to form a silane coupling agent layer on the heat sensitive layer. Especially when an addition type silicone is used for the silicone rubber layer, this is necessary since the silicone rubber is not adhesive.

As a result, the printing durability and solvent resistance of the printing plate are greatly improved.

The silane coupling agents which can be used here include all those publicly known such as vinylsilanes, (meth)acryloylsilanes, epoxysilanes, aminosilanes mercaptosilanes and chlorosilanes. Among them, (meth) acryloylsilanes, epoxysilanes, aminosilanes and mercaptosilanes can be preferably used.

Specifically, the (meth)acryloylsilanes include 3-(meth) acryloylpropyl-trimethoxysilane and 3-(meth) acryloylpropyltriethoxysilane. The epoxysilanes include 3-glycidoxypropyltrimethoxysilaneand2-(3,4-epoxycyclohexyl)ethyltrimethoxysilane. The aminosilanes include N-2-(aminoethyl)-3-aminopropyltrimethoxysilane, N-2-(aminoethyl)-3-aminopropylmethyldimethoxysilane and 3-aminopropyltriethoxysilane. The mercaptosilanes include 3-mercaptopropyltrimethoxysilane and 3-mercaptopropyltriethoxysilane.

Any of these silane coupling agents is dissolved into a proper solvent, and the diluted solution is applied onto the heat sensitive layer, and thermally cured.

The silane coupling agent layer is only required to be thick enough to form a monomolecular film of the silane coupling agent, specifically preferably 1000 Å or less, more preferably 500 Å or less.

If the thickness is thicker than 1000 Å, the sensitivity of the printing plate declines, and the printing durability and the solvent resistance decline.

If a metal layer is used as the heat sensitive layer, the heat insulating layer can be formed by only any one of said polymers of 20° C. or lower in Tg, since the heat insulating layer is not eroded by a solvent, etc. when the heat sensitive layer is applied. If a thermoplastic polymer only is applied, the crosslinking by heating is not required, and the temperature of the oven can be kept low.

The silicone rubber layer is described below. For the silicone rubber layer, all the silicone compositions used in the conventional waterless planographic printing plates can be used.

The silicone rubber layer can be obtained by sparsely crosslinking a linear organopolysiloxane (preferably dimethylpolysiloxane), and a typical silicone rubber layer has a component represented by the following formula (I):

(I)

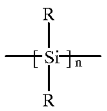

(where n stands for an integer of 2 or more; R stands for an alkyl group with 1 to 10 carbon atoms, aryl group or cyanoalkyl group; it is preferable that 40% or less of all the groups represented by R are vinyl groups, phenyl groups, halogenated vinyl groups, halogenated phenyl groups, and that 60% or more of all the groups represented by R are methyl groups; and the molecular chain has at least one or more hydroxyl groups at the ends of the chain or as side chains.)

The silicone rubber layer used in the printing plate of the present invention uses a silicone rubber to be condensation-crosslinked as described below (RTV or LTV type silicone rubber). As such a silicone rubber, a silicone rubber in which some of R groups of the organopolysiloxane chain are substituted by H can also be used, but the silicone rubber used is usually crosslinked by condensation between the end groups represented by any of the formulae (II), (III) and (IV). There is also a case where an excessive amount of a crosslinking agent is added for presence.

(II)

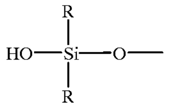

(III)

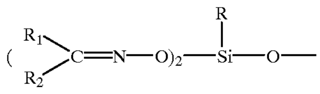

(IV)

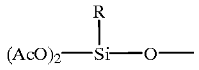

(where R is as defined before, and $R_1$ and $R_2$ stand for, respectively independently, a monovalent lower alkyl group; and Ac stands for an acetyl group.)

To the silicone rubber to be crosslinked by condensation, a metal carboxylate of tin, zinc, lead, calcium or manganese, etc., for example, dibutyltin laurate, tin (II) octoate or naphtenate or chloroplatinic acid is added as a catalyst.

To the composition, any publicly known tackifier such as an alkenyltrialkoxy-silane can be added as desired, and a hydroxyl group-containing organopolysiloxane or hydrolyzable functional group-containing silane (or siloxane) can be added as desired, as a component of the condensation type silicone rubber layer. Furthermore, to enhance the rubber strength, a publicly known filler such as silica can also be added as desired.

To the composition, for enhancing the adhesiveness to the heat sensitive layer, any of the publicly known silane coupling agents described before can also be added effectively.

If a silane coupling agent is added into the silicone rubber layer, it is not necessary to form a silane coupling agent layer additionally.

Furthermore, in the present invention, in addition to said condensation type silicone rubber, an addition type silicone rubber can also be used.

The addition type silicone rubber which can be preferably used is obtained by crosslinking and hardening a hydrogenpolysiloxane with Si—H bonds and a vinylpolysiloxane with CH—CH bonds by a platinum based catalyst as shown below.

| | |
|---|---|
| (1) Organopolysiloxane with at least two alkenyl groups (desirably vinyl groups) directly connected to Silicon atoms in one molecule | 100 parts by weight |
| (2) Organohydrogenpolysiloxane with at least two groups represented by formula (V) in one molecule | 0.1 to 1000 parts by weight |
| (3) Addition catalyst | 0.00001 to 10 parts by weight |
| (4) Silane couplingagent | 0.001 to 10 parts by weight |

The alkenyl groups of the ingredient (1) can be located at the ends or intermediate positions of the molecular chain, and organic groups other than alkenyl groups are substituted or non-substituted alkyl groups and aryl groups. The ingredient (1) may have a slight amount of hydroxyl groups. The ingredient (2) reacts with the ingredient (1) to form a silicone rubber layer, and acts to give adhesiveness to the heat sensitive layer. The hydroxyl groups of the ingredient (2) can be located at the ends or intermediate positions of the molecular chain, and organic groups other than hydrogen can be selected from those stated for the ingredient (1). It is preferable that 60% or more of the organic groups of the ingredients (1) and (2) are methyl groups in view of higher ink repellency. The molecular structures of the ingredients (1) and (2) can be of straight chain, cyclic or of branched chain, and it is preferable in view of the physical properties of the rubber that the molecular weight of at least either of the ingredients (1) and (2) is more than 1000. It is more preferable that the molecular weight of the ingredient (2) exceeds 1000. The ingredient (1) can be selected, for example, from α,ω-divinylpolydimethylsiloxane, (methylvinylsiloxane) (dimethylsiloxane) copolymer with methyl groups at both the ends, etc. The ingredient (2) can be selected, for example, from polydimethylsiloxane with hydroxyl groups at both the ends, α,ω-dimethylpolymethylhydrogensiloxane, (methylhydrogensiloxane) (dimethylsiloxane) copolymer with methyl groups at both the ends, cyclic polymethylhydrogensiloxane, etc. The addition catalyst as the ingredient (3) can be selected from publicly known catalysts as desired, and especially a platinum compound such as platinum, platinum chloride, chloroplatinic acid or olefin coordinated platinum is desirable. The silane coupling agent as the ingredient (4) is preferably a compound with an unsaturated bond to react with the hydrogensiloxane in the addition type silicone rubber composition and with a functional group (e.g., alkoxy group, oxime group, acetoxy group, chloro group, epoxy group, etc.) to react with the hydrogel groups and amino groups in the heat sensitive layer, or a composition containing the compound.

As the above compound, usually any of all the compositions marketed as primers for addition type silicone rubber can be used.

Examples of the primers for addition type silicone rubber are "ME151" produced by Toshiba Silicone K.K., and "SH2260", "DY39-012", "DY39-067", "DY39-080", "Primer X", "Primer-Y", etc. produced by Toray Dow Corning Silicone K.K.

Most of them contain an unsaturated bond-containing silane coupling agent as the main component and a small amount of a catalyst as an additive, and diluted by a solvent.

An unsaturated bond-containing silane coupling agent can also be used as it is.

In this case, the unsaturated bond-containing silane coupling agent can be selected from vinylsilanes, allylsilanes, (meth)acrylsilanes, etc.

The vinylsilanes include, for example, vinyltrimethoxysilane, vinyltriethoxysilane, vinyltris(2-methoxyethoxy)silane, divinyldimethoxysilane, divinyldiethoxysilane, divinyldi(2-methoxyethoxy)silane, trivinylmethoxysilane, trivinylethoxysilane, trivinyl(2-methoxyethoxy)silane, etc.

The allylsilanes include, for example, allyltrimethoxysilane, allyltriethoxy-silane, allyltris(2-methoxyethoxy)silane, diallyldimethoxysilane, diallyldiethoxysilane, diallyldi(2-methoxyethoxy)silane, triallylmethoxysilane, triallylethoxysilane, triallyl(2-methoxyethoxy)silane, etc.

The (meth)acrylsilanes include, for example, 3-(meth)acryloxypropyl-trimethoxysilane, 3-(meth)acryloxypropyltriethoxysilane, di(3-(meth)acryloxypropyl)-dimethoxysilane, di(3-(meth)acryloxypropyl)diethoxysilane, tri(3-(meth)acryloxy-propyl)methoxysilane, tri(3-(meth)acryloxypropyl)ethoxysilane, etc.

Among them, vinyltrimethoxysilane, vinyltriethoxysilane, allyltrimethoxy-silane and allyltriethoxysilane can be preferably used.

The amount of any of the primers for addition type silicone rubber and silane coupling agents is preferably 0.01 to 5 wt %, more preferably 0.05 to 2 wt % as a solute component based on the weight of the entire composition of the heat sensitive layer.

If the amount is smaller than 0.01 wt %, the adhesiveness to the silicone rubber layer is likely to decline, and if larger than 5 wt %, the stability of the solution is likely to decline.

As the catalyst, a reaction catalyst for addition type silicone is used.

For the catalyst, almost all the transition metal complexes of group VIII can be used, but in general, platinum compounds can be preferably used since they are highest in reaction efficiency and good in solubility.

Among platinum compounds, preferably used are platinum, platinum chloride, chloroplatinic acid, olefin coordinated platinum, alcohol modified platinum complex, and methylvinylpolysiloxane platinum complex.

Adding a catalyst for promoting the dealcoholation reaction of the silane coupling agent (reaction with the hydroxyl groups in the heat sensitive layer) is also effective.

As the catalyst, a tin based compound or a titanium based compound can be preferably used.

The tin based compounds which can be used here include dibutyltin diacetate, dibutyltin dilaurate, dibutyltin dioctoate, tin octylate, dioctyltin dioctoate, dioctyltin oxide, dioctyltin dilaurate and tin stearate. The titanium based compounds which can be used here include tetramethyl titanate, tetraethyl titanate, tetrapropyl titanate, tetraisopropyl titanate, tetrabutyl titanate, etc.

Among them, dibutyltin diacetate, dibutyltin dilaurate, dibutyltin dioctoale, tetraisopropyl titanate, tetrabutyl titanate, etc. can be preferably used.

The amount of the catalyst added is preferably 0.001 to 5 wt %, more preferably 0.01 to 1 wt % as solid content based on the weight of the entire composition of the heat sensitive layer.

If the amount is smaller than 0.001 wt %, the adhesiveness to the heat sensitive layer is likely to decline, and if larger than 5 wt %, the stability of the solution is likely to decline.

To control the hardening rate of the composition, a crosslinking inhibitor can also be added, which can be selected from organopolysiloxanes containing vinyl groups such as tetracyclo(methylvinyl)siloxane, alcohols containing a carbon—carbon triple bond, acetone, methyl ethyl ketone, methanol, ethanol and propylene glycol monomethyl ether. In the case of the above composition, when three ingredients are mixed, addition reaction occurs, and hardening begins. It is characteristic that the hardening speed becomes sharply high according to the rise of reaction temperature. So, in order to elongate the pot life till the rubberization of the composition and to shorten the hardening time on the heat sensitive layer, it is preferable in view of the stability of the adhesiveness to the heat sensitive layer that the composition is hardened in a temperature range not to change the properties of the substrate or the heat sensitive layer, and that a high temperature is kept till perfect hardening is achieved. The thickness of the silicone rubber layer is preferably 0.5 to 50 $g/m^2$, more preferably 0.5 to 10 $g/m^2$. If the thickness is smaller than 0.5 $g/m^2$, the ink repellency of the printing plate is likely to decline, and if larger than 50 $g/m^2$, an economical disadvantage is inevitable.

As the substrate of the directly imageable raw plate for waterless planographic printing plate as described above, a dimensionally stable sheet is used. The dimensionally stable sheets which can be suitably used here include those used for conventional printing sheets. These substrates include paper, paper laminated with a plastic (e.g., polyethylene, polypropylene or polystyrene, etc.), metallic sheets of aluminum (including an aluminum alloy), zinc, copper, etc., plastic films of cellulose, carboxymethyl cellulose, cellulose acetate, polyethylene terephthalate, polyethylene, polyester, polyamide, polyimide, polystyrene, polypropylene, polycarbonate, polyethylene, acetal, etc., and paper and plastic films laminated or vapor-deposited with any of the above metals, and so on. Of these substrates, an aluminum sheet is especially preferable since it is dimensionally very stable and inexpensive. A polyethylene terephthalate film used as a substrate for short run printing can also be preferably used.

For protecting the silicone rubber layer formed on the surface of the directly imageable raw plate for waterless planographic printing plate composed as above, a plane or roughened thin protective film can be laminated on the surface of the silicone rubber layer, or a coating film of a polymer soluble in the development solvent as described in Japanese Patent Laid-Open (Kokai) No. 5-323588 can also be formed. Especially when a protective film is laminated, a printing plate can also be prepared by forming an image by a laser from above the protective film, and removing the protective film, to form a pattern on the printing plate by the so-called removal development.

The method for producing a directly imageable raw plate for waterless planographic printing plate of the present invention is described below. A substrate is coated with a composition destined to be a heat insulating layer as required, by using any of the apparatuses described before, and the composition is hardened at 100 to 300° C. for several minutes. Then, the heat insulating layer is further coated with a composition destined to be a heat sensitive layer, and the composition is dried at 50 to 10 180° C. for several minutes, and thermally cured as required. The heat sensitive layer is further coated with a silicone rubber composition, and the composition is heat-treated at 50 to 150° C. for several minutes, to be hardened as rubber.

Subsequently as required, a protective film is laminated or a protective layer is formed.

The directly imageable raw plate for waterless planographic printing plate obtained like this is exposed to an image using a laser beam after removing the protective film or from above the remaining protective film.

For exposure, usually a laser beam is used. As the light source in this case, various lasers of 300 nm to 1500 nm in wavelength can be used, which include Ar ion laser, Kr ion laser, He-Ne laser, He-Cd laser, ruby laser, glass laser, semiconducter laser, YAG laser, titanium sapphire laser, dye laser, nitrogen laser, metal vapor laser, etc. Among them, a semiconductor laser is preferable, since it is downsized due to the technical progress in recent years, and is economically more advantageous than other lasers.

The directly imageable waterless planographic printing plate exposed as described above is subjected, as required, to removal development or ordinary solvent development.

The developers which can be used in the present invention include water, water containing any of the following polar solvents, and any one or more as a mixture of aliphatic hydrocarbons (hexane, heptane, "Isopar E, G and H" (trade names of isoparaffin based hydrocarbons produced by ESSO), gasoline, kerosene, etc.), aromatic hydrocarbons (toluene, xylene, etc.), halogenated hydrocarbons (trichlene, etc.) respectively with at least one of the following polar solvents added.

Alcohols (methanol, ethanol, propanol, isopropanol, ethylene glycol, diethylene glycol, triethylene glycol, polyethylene glycol, propylene glycol, dipropylene glycol, tripropylene glycol, polypropylene glycol, 1,3-butylene glycol, 2,3-butylene glycol, hexylene glycol, 2-ethyl-1,3-hexanediol, etc.)

Ethers (ethylene glycol monoethyl ether, diethylene glycol monoethyl ether, diethylene glycol monobutyl ether, diethylene glycol monohexyl ether, diethylene glycol mono-2-ethylhexyl ether, triethylene glycol monoethyl ether, tetraethylene glycol monoethyl ether, propylene glycol monomethyl ether, dipropylene glycol monomethyl ether, tripropylene glycol monomethyl ether, dioxane, tetrahydrofuran, etc.)

Ketones (acetone, methyl ethyl ketone, methyl isobutyl ketone, diacetone alcohol, etc.)

Esters (ethyl acetate, butyl acetate, methyl lactate, ethyl lactate, ethylene glycol monomethyl ether acetate, ethylene glycol monoethyl ether acetate, diethylene glycol monomethyl ether acetate, diethylene glycol monomethyl ether acetate, etc.)

Carboxylic acids (2-ethylbutyric acid, caproic acid, caprylic acid, 2-ethylhexanoic acid, capric acid, oleic acid, lauric acid, etc.)

The above developer composition can contain a publicly known surfactant as desired. Furthermore, an alkaline material such as sodium carbonate, monoethanolamine, diethanolamine, diglycolamine, monoglycolamine, triethanolamine, sodium silicate, potassium silicate, potassium hydroxide or sodium borate can also be added.

To the developer, any publicly known basic dye, acid dye or oil soluble dye such as Crystal Violet or Victoria Pure Blue, Astrazon Red, etc. can also be added, for dyeing the image area concurrently with development.

For development, a nonwoven fabric, absorbent cotton, cloth or sponge, etc. impregnated with such a developer can be used to wipe the plate surface, to execute development.

Furthermore, for favorable development, an automatic processing machine as described in JP-A-63-163357 can be used to pretreat the plate surface by the developer and subsequently to rub the plate surface by a rotary brush while showering with tap water, etc.

Even if hot water or water vapor is used instead of the developer, to be jetted onto the plate surface, development can be executed.

The present invention is described below in more detail in reference to examples, but is not limited thereto or thereby.

The following testing methods were used for measuring tensile properties according to JIS K 6301. (Method for measuring the tensile properties of a heat insulating layer)

A glass sheet was coated with a heat insulating solution, and the solvent was volatilized. The remaining composition was hardened by heating at 180° C. Then, the formed sheet was removed from the glass sheet, as an about 100 $\mu$ thick sheet. From the sheet, strip samples of 5 mm×40 mm were cut off and Tensilon RTM-100 (produced by Orientech K.K.) was used to measure the initial elastic modulus, 10%, stress and breaking elongation at a tensile speed of 20 cm/min. (Method for measuring the tensile properties of a heat sensitive layer)

A glass sheet was coated with a solution destined to be a heat sensitive layer, and the solvent was volatilized. The remaining composition was hardened by heating at 150° C., to form a heat sensitive layer. Subsequently as described for the heat insulating layer, the initial elastic modulus, 5% stress and breaking elongation were measured. (Method for measuring the tensile properties of a laminate consisting of a heat insulating layer and a heat sensitive layer)

A glass sheet was coated with a heat insulating layer under the conditions as described above, and further coated with a heat sensitive layer on the heat insulating layer under the conditions as described above. Subsequently as described for the heat insulating layer, the initial elastic modulus, 5% stress and breaking elongation were measured.

Furthermore, a composition consisting of a binder resin and a crosslinking agent only in a heat sensitive layer was heated at 150° C., and Tg was measured using a dilatometer.

EXAMPLE 1

A 0.24 mm thick degreased aluminum sheet was coated with a heat insulating solution with the following composition, and dried at 230° C. for 2 minutes, to form a 5 $g/m^2$ thick heat insulating layer.

| | |
|---|---|
| (a) Polyurethane resin "Miractran" P22S (produced by Nippon Miractran K.K.) | 100 parts by weight |
| (b) Blocked isocyanate "Takenate B830" (produced by Takeda Chemical Industries, Ltd.) | 20 parts by weight |
| (c) Epoxy · phenol · urea resin "SJ9372" (produced by Kansai Paint Co., Ltd.) | 8 parts by weight |

-continued

| | |
|---|---|
| (d) Dibutyltin diacetate | 0.5 part by weight |
| (e) Victoria Pure Blue BOH naphthalenesulfonic acid | 0.1 part by weight |
| (f) Dimethylformamide | 720 parts by weight |

The heat insulating layer was further coated with the following composition destined to be a heat sensitive layer, and dried at 130° C. for 1 minute, to form a 2 $g/m^2$ thick heat sensitive layer.

| | |
|---|---|
| (a) Nitrocellulose (½ second in viscosity, 11.0% in nitrogen content, "Bergerac NC" produced by SNPE Japan K.K.) | 24 parts by weight |
| (b) Carbon black | 30 parts by weight |
| (c) Polyurethane ("Sanprene" LQ-T1331, produced by Sanyo Chemical Industries, Ltd.) | 30 parts by weight |
| (d) Modified epoxy resin ("Epoky" 803, produced by Mitsui Toatsu Chemicals, Inc.) | 15 parts by weight |
| (e) Epoxy acrylate ("Denacol Acrylate" DA-314, produced by Nagase Kasei Kogyo K.K.) | 15 parts by weight |
| (g) Diethylenetriamine | 5 parts by weight |
| (g) Methyl isobutyl ketone | 600 parts by weight |

In succession, the heat sensitive layer was coated with a silicone rubber solution with the following composition, and dried at 120° C. for 2 minutes, to form a 3 $g/m^2$ thick silicone rubber layer.

| | |
|---|---|
| (a) Vinylpolydimethylsiloxane | 100 parts by weight |
| (b) Hydrogensiloxane | 12 parts by weight |
| (c) Platinum catalyst | 0.2 part by weight |
| (d) Hardening retarder | 2 parts by weight |
| (e) Allyltrimethoxysilane | 0.5 part by weight |
| (f) "Isopar E" (produced by Exxon Kagaku K.K.) | 1200 parts by weight |

Onto the laminate obtained as above, an 8 $\mu$m thick polyester film "Lumirror" (produced by Toray Industries, Inc.) was laminated using a calender roller, to obtain a directly imageable raw plate for waterless planographic printing plate.

Subsequently, the "Lumirror" film was removed from the original printing plate, and the plate was pulse-exposed to a laser beam of 20 $\mu$m in diameter for 10 $\mu$s using a semiconductor laser (SLD-304XT, 1 W in output, 809 nm in wavelength, produced by Sony Corp.) mounted on an X-Y table. The laser output was changed as desired by an LD pulse modulation drive, the laser power on the plate surface was measured.

In succession, the plate surface was rubbed by a cotton pad impregnated with a developer with the following composition, for development, and the image reproducibility was visually evaluated using an optical microscope.

| | |
|---|---|
| (a) Water | 80 parts by weight |
| (b) Diethylene glycol mono-2-ethylhexyl ether | 20 parts by weight |

The obtained printing plate was installed on a four-color printing machine, Komori Sprint 425BP (produced by Komori Corporation), and coat paper was printed using inks for waterless planographic printing plate. The number of sheets printed till the silicone rubber layer was peeled to form pinholes at the non-image area, soiling the paper surface was identified as an indicator of printing durability.

EXAMPLE 2

A waterless planographic printing plate was produced as described in Example 1, except that the heat insulating layer and the heat sensitive layer were formed by using the following compositions, and the image reproducibility and printing durability were evaluated as described in Example 1. Composition of heat insulating layer

| | |
|---|---|
| (a) Epoxy · phenol resin "Kancoat" 90T-25-3094 (produced by Kansai Paint Co., Ltd.) | 15 parts by weight |
| (b) Victoria Pure Blue BOH naphthalenesulfonic acid | 0.1 part by weight |
| (c) Polyurethane ("Sanprene" LQ-T1331, produced by Sanyo Chemical Industries, Ltd.) | 20 parts by weight |
| (d) Dimethylformaide | 85 parts by weight |

Composition of heat sensitive layer

| | |
|---|---|
| (a) Nitrocellulose (½ second in viscosity, 11.0% in nitrogen content, "Bergerac NC", produced by SNPE Japan K.K.) | 24 parts by weight |
| (b) Carbon black | 30 parts by weight |
| (c) Polyurethane ("Sanprene" LQ-T1331, produced by Sanyo Chemical Industries, Ltd.) | 45 parts by weight |
| (d) Modified epoxy resin ("Epoky" 803, produced by Mitsui Toatsu Chemicals, Inc.) | 15 parts by weight |
| (e) Epoxy acrylate ("Denacol Acrylate" DA-314, produced by Nagase Kasei Kogyo K.K.) | 15 parts by weight |
| (f) Diethylenetriamine | 5 parts by weight |
| (g) Methyl isobutyl ketone | 600 parts by weight |

EXAMPLE 3

A waterless planographic printing plate was produced as described in Example 1, except that the heat sensitive layer was formed by using the following composition, and the image reproducibility and printing durability were evaluated as described in Example 1.

| | |
|---|---|
| (a) Nitrocellulose (½ second in viscosity, 11.0% in nitrogen content, "Bergerac NC", produced by SNPE Japan K.K.) | 24 parts by weight |
| (b) Carbon black | 30 parts by weight |
| (c) Polyurethane ("Sanprene" LQ-T1331, produced by Sanyo Chemical Industries, Ltd.) | 15 parts by weight |
| (d) Modified epoxy resin ("Epoky" 803, produced by Mitsui Toatsu Chemicals, Inc.) | 15 parts by weight |
| (e) Diethylenetriamine | 5 parts by weight |
| (f) Methyl isobutyl ketone | 600 parts by weight |

COMPARATIVE EXAMPLE 1

A waterless planographic printing plate was produced as described in Example 1, except that the heat insulating layer, heat sensitive layer and ink repellent layer were formed by using the following compositions, and the image reproducibility and printing durability were evaluated as described in Example 1. Composition of heat insulating layer

| | |
|---|---|
| (a) Epoxy · phenol resin "Kancoat" 90T-25-3094 (produced by Kansai Paint Co., Ltd.) | 15 parts by weight |
| (b) Victoria Pure Blue BOH naphthalenesulfonic acid | 0.1 part by weight |
| (c) Dimethylformamide | 85 parts by weight |

Composition of heat sensitive layer

| | |
|---|---|
| (a) Nitrocellulose (½ in viscosity, 11.0% in nitrogen content, "Bergerac NC" produced by SNPE Japan K.K.) | 24 parts by weight |
| (b) Carbon black | 30 parts by weight |
| (c) Modified epoxy resin ("Epoky" 803, produced by Mitsui Toatsu Chemicals, Inc.) | 15 parts by weight |
| (d) Epoxy acrylate ("Denacol Acrylate" DA-314, produced by Nagase Kasei Kogyo K.K.) | 15 parts by weight |
| (e) Diethyltriamine | 5 parts by weight |
| (f) Methyl isobutyl ketone | 600 parts by weight |

Composition of ink repellent layer

| | |
|---|---|
| (a) Polydimethylsiloxane (about 35,000 in molecular weight, with hydroxyl groups at the ends) | 100 parts by weight |
| (b) Ethyltriacetoxysilane | 3 parts by weight |
| (c) Dibutyltin diacetate | 0.1 part by weight |
| (d) "Isopar G" (produced by Exxon Kagaku K.K.) | 1200 parts by weight |

COMPARATIVE EXAMPLE 2

A waterless planographic printing plate was produced as described in Comparative Example 1, except that the heat sensitive layer was formed by using the following composition, and the image reproducibility and printing durability were evaluated as described in Example 1.

| | |
|---|---|
| (a) Nitrocellulose (½ second in viscosity, 11.0% in nitrogen content, "Bergerac NC", produced by SNPE Japan K.K.) | 24 parts by weight |
| (b) Carbon black | 30 parts by weight |
| (c) Polyester ("Nichigo Polyester" TP-220, produced by The Nippon Synthetic Chemical Industry Co., Ltd.) | 5 parts by weight |
| (d) Modified epoxy resin ("Epoky" 803, produced by Mitsui Toatsu Chemical Industries, Inc.) | 15 parts by weight |
| (e) Epoxy acrylate ("Denacol Acrylate" DA-314, produced by Nagase Kasei Kogyo K.K.) | 15 parts by weight |
| (f) Diethyltriamine | 5 parts by weight |
| (g) Methyl isobutyl ketone | 600 parts by weight |

Measured tensile properties of the heat insulating layers, heat sensitive layers and laminates consisting of a heat insulating layer and a heat sensitive layer, of Examples 1 to 3 and Comparative Examples 1 and 2 are shown in Table 1, and evaluation results on the image reproducibility and printing durability and measured Tg values of the binder resins and crosslinking agents in the respective heat insulating layers are shown in Table 2.

As shown in Table 2, it can be seen that if the tensile properties of the heat insulating layer, heat sensitive layer or the laminate consisting of a heat insulating layer and a heat sensitive layer conform to the specified ranges, the printing durability of the directly imageable waterless planographic printing plate can be enhanced.

EXAMPLES 4 to 9

In the following examples, the blackness was visually evaluated in reference to five stages with the blackness of the printing plate produced by Vulcan XC-72 as the 3rd stage, and with the highest blackness as the 5th stage.

A 0.24 mm thick degreased aluminum plate was coated with a heat insulating solution with the following composition, dried at 230° C. for 1 minute, to form a 3 $g/m^2$ thick heat insulating layer.

| | |
|---|---|
| (a) Kancoat 90T-25-3094 (epoxyphenol resin, produced by Kansai Paint Co., Ltd.) | 15 parts by weight |
| (b) Victoria Pure Blue BOH naphthalenesulfonic acid | 0.1 part by weight |
| (c) Polyurethane ("Sanprene" LQ-T1331, produced by Sanyo Chemical Industries, Ltd.) | 20 parts by weight |
| (d) Dimethylformamide | 85 parts by weight |

The photosensitive layer was coated with the following composition destined to be a heat sensitive layer, and dried at 130° C. for 1 minute, to form a 2 $g/m^2$ thick heat sensitive layer.

| | |
|---|---|
| (a) Nitrocellulose (½ second in viscosity, 11.0% in nitrogen content, "Bergerac NC", produced by SNPE Japan K.K.) | 24 parts by weight |
| (b) Carbon black(Table 3) | |
| (c) Polyester resin ("Vylon 300", produced by Toyobo Co., Ltd.) | 30 parts by weight |
| (d) Modified epoxy resin ("Epoky" 803, produced by Mitsui Toatsu Chemicals, Inc.) | 15 parts by weight |
| (e) Epoxy acrylate ("Denacol Acrylate" DA-314, produced by Nagase Kasei Kogyo K.K.) | 15 parts by weight |
| (f) Diethylenetriamine | 5 parts by weight |
| (g) Methyl isobutyl ketone | 600 parts by weight |

In succession, the photosensitive layer was coated with a silicone rubber solution with the following composition, and dried at 120° C. for 2 minutes, to form a 3 $g/m^2$ thick silicone rubber.

| | |
|---|---|
| (a) Vinylpolydimethylsiloxane | 100 parts by weight |
| (b) Hydrogensiloxane | 12 parts by weight |
| (c) Platinum catalyst | 0.2 part by weight |
| (d) Hardening retarder | 2 parts by weight |
| (e) Silicone primer "DY39-067" (produced by Toray Dow Corning Silicone K.K.) | 0.1 part by weight |
| (f) "Isopar E" (produced by Exxon Kagaku K.K.) | 1200 parts by weight |

Onto the laminate obtained as described above, an 8 μm thick polyester film "Lumirror" (produced by Toray Industries, Inc.) was laminated using a calender roller, to obtain a directly imageable raw plate for waterless planographic printing plate.

COMPARATIVE EXAMPLES 3 TO 5

Printing plates were produced as described in Example 4, except that the heat insulating layer and the heat sensitive layer were formed by using the following compositions.

Composition of heat insulating layer

| | |
|---|---|
| (a) Kancoat 90T-25-3094 (Epoxyphenol resin, produced by Kansai Paint Co., Ltd.) | 15 parts by weight |
| (b) Victoria Pure Blue BOH naphthalenesulfonic acid | 0.1 part by weight |
| (c) Dimethylformamide | 85 parts by weight |

Composition of heat sensitive layer

| | |
|---|---|
| (a) Nitrocellulose (½ second in viscosity, 11.0% in nitrogen content, "Bergerac NC", produced by SNPE Japan K.K.) | 24 parts by weight |
| (b) Carbon black (Table 3) | |
| (d) Modified epoxy resin ("Epoky" 803, produced by Mitsui Toatsu Chemicals, Inc.) | 15 parts by weight |
| (e) Epoxy acrylate ("Denacol Acrylate" DA-314, produced by Nagase Kasei Kogyo K.K.) | 15 parts by weight |
| (f) Diethylenetriamine | 5 parts by weight |
| (g) Methyl isobutyl ketone | 600 parts by weight |

The "Lumirror" film was removed from the original printing plate, and the plate was pulse-exposed to a laser beam of 20 μm in diameter for 10 μs using a semiconductor laser (SLD-304XT, 1 W in output, 809 nm in wavelength, produced by Sony Corp.) mounted on an X-Y table. The laser output was changed as desired by an LD pulse modulation drive, and the laser power on the plate surface was measured.

In succession, the plate surface was rubbed by a cotton pad impregnated with a developer with the following composition, for development.

| | |
|---|---|
| (a) Water | 80 parts by weight |
| (b) Diethylene glycol mono-2-ethylhexyl ether | 20 parts by weight |

The image reproducibility of the printing plate was evaluated by a 50-fold magnifying lens, to decide the minimum laser power for forming dots, and from the result, the sensitivity of the printing plate was measured. The result is shown in Table 3.

From Table 3, it can be seen that if the grain size of carbon black or the oil absorption of carbon black does not conform to the specified ranges, the sensitivity declines.

SYNTHESIZING EXAMPLES 1 TO 6

Fifty milliliters of concentrated sulfuric acid was put into a 200 ml Erlenmeyer flask, and 50 ml of fuming nitric acid was added gradually along a glass rod. After completion of addition, the mixture was cooled by water, to prepare a mixed acid. One gram of an absolute dry cellulose sample (fibrous, produced by Nakarai Tesque K.K.) was accurately weighed, and the acid was added little by little. The mixture was stirred at room temperature for a predetermined time.

After completion of stirring, the reaction product was filtered by a glass filter, and the residue was washed by icy water three times, finally washed by methanol, and dried by a 50° C. dryer. The obtained nitrocellulose was accurately weighed. (Compounds 1 to 6)

If the weight of the obtained nitrocellulose is x (g), the nitrogen content (%) can be calculated from the following formula:(Table 4)

$$31.1\times(1-1/x)$$

EXAMPLES 10 TO 13

A 0.15 mm aluminum sheet (produced by Suitomo Metal Industries, Ltd.) was coated with the following heat insulating composition using a bar coater, and heat-treated at 220° C. for 2 minutes, to form a 5 g/$m^2$ heat insulating layer.

| | |
|---|---|
| (a) Polyurethane resin (Sanprene LQ-T1331, produced by Sanyo Chemical Industries, Ltd.) | 90 parts by weight |
| (b) Block isocyanate (Takenate B830, produced by Takeda Chemical Industries, Ltd.) | 15 parts by weight |
| (c) Epoxy · phenol · urea resin (SJ9372, produced by Kansai Paint Co., Ltd.) | 8 parts by weight |
| (d) Tetraglycerol dimethacrylate | 0.2 part by weight |
| (e) Dimethylformamide | 725 parts by weight |

In succession, the heat insulating layer was coated with the following composition destined to be a heat sensitive layer using a bar coater, and dried in 140° C. air for 1 minute, to form a 3 g/$m^2$ thick heat sensitive layer.

| | |
|---|---|
| (a) Nitrocellulose (any of compounds 1 to 4, Table 4) | 20 parts by weight |
| (b) Copper phthalocyanine (produced by Nakarai Tesque K.K.) | 2 parts by weight |
| (c) Carbon black "RAVEN1255" (produced by Columbian Carbon Nippon K.K.) | 23 parts by weight |
| (d) Epoxy resin "Denacol" EX512 (produced by Nagase Kasei Kogyo K.K.) | 50 parts by weight |
| (e) Urea resin "Beccamin" P-138 | 10 parts by weight |
| (f) Polyester resin ("Vylon 300" produced by Toyobo Co., Ltd.) | 15 parts by weight |
| (g) Methyl ethyl ketone | 700 parts by weight |

In succession, the heat sensitive layer was coated with a silicone rubber solution with the following composition, and dried at 120° C. for 2 minutes, to form a 3 g/$m^2$ thick silicone rubber layer.

| | |
|---|---|
| (a) Vinylpolydimethylsiloxane | 100 parts by weight |
| (b) Hydrogensiloxane | 12 parts by weight |
| (c) Platinum catalyst | 0.2 part by weight |
| (d) Hardening retarder | 2 parts by weight |
| (e) Allyltriethoxysilane | 0.2 part by weight |
| (f) "Isopar E" (Exxon Kagaku K.K.) | 1200 parts by weight |

COMPARATIVE EXAMPLES 6 AND 7

Printing plates were produced as described in Example 10, except that the heat insulating layer, heat sensitive layer and ink repellent layer were formed by using the following compositions.

Composition of heat insulating layer

| | |
|---|---|
| (a) Kancoat 90T-25-3094 (epoxyphenol resin, produced by Kansai Paint Co., Ltd.) | 15 parts by weight |
| (b) Victoria Pure Blue BOH naphthalenesulfonic acid | 0.1 part by weight |
| (c) Dimethylformamide | 85 parts by weight |

Composition of heat sensitive layer

| | |
|---|---|
| (a) Nitrocellulose (either of compounds 5 and 6, Table 4) | 20 parts by weight |
| (b) Copper phthalocyanine (Nakarai Tesque K.K.) | 2 parts by weight |
| (c) Carbon black "RAVEN1255" (produced by Columbian Carbon Nippon K.K.) | 23 parts by weight |
| (d) Epoxy resin "Denacol" EX512 (produced by Nagase Kasei Kogyo K.K.) | 50 parts by weight |
| (e) Urea resin "Beccamin" P-138 | 10 parts by weight |
| (f) Methyl ethyl ketone | 700 parts by weight |

Composition of ink repellent layer

| | |
|---|---|
| (a) Polydimethylsiloxane (about 35,000 in molecular weight, with hydroxyl groups at the ends) | 100 parts by weight |
| (b) Vinyltrioximesilane | 5 parts by weight |
| (c) Dibutyltin diacetate | 0.2 part by weight |
| (d) "Isopar G" (produced by Exxon Kagaku K.K.) | 1200 parts by weight |

This original printing plate was pulse-exposed to a laser beam of 20 μm in diameter for 10 μm using a semiconductor laser (OPC-A001-mmm-FC, 0.75 W in output, 780 nm in wavelength, produced by Opto Power Corporation) mounted on an X-Y table.

The exposed plate was developed at room temperature (25° C.) at a humidity of 80% using TWL 1160 (waterless planographic printing plate developing machine produced by Toray Industries, Inc., 100 cm/min in processing speed). As the developer, water was used. As a dyeing solution, a solution with the following composition was used.

| | |
|---|---|
| (a) Ethyl carbitol | 18 parts by weight |
| (b) Water | 79.9 parts by weight |
| (c) Crystal Violet | 0.1 part by weight |
| (d) 2-ethylhexanoic acid | 2 parts by weight |

The image reproducibility of the printing plate was evaluated using a 50-fold magnifying lens, to decide the minimum laser power for forming dots, and from the result, the sensitivity of the printing plate was measured.

Furthermore, the printing plate was installed on an offset press, and printing was executed using "Dry-O-Color" black, cyan, red and yellow inks produced by Dainippon Ink & Chemicals, Inc. The number of printed sheets at which the plate surface was observed to be damaged was identified as printing durability. The results is shown in Table 4.

From Table 4, it can be seen that the printing durability of the printing plate declines extremely if the nitrogen content of nitrocellulose is 11.5% or more, or if the viscosity of nitrocellulose does not conform to the specified range.

EXAMPLES 14 TO 19

A 0.25 mm thick degreased aluminum sheet was coated with a heat insulating solution with the following composition, and dried at 230° C. for 1 minutes, to form a 3 g/$m^2$ thick heat insulating layer.

| | |
|---|---|
| (a) Kancoat 90T-25-3094 (epoxyphenol resin, produced by Kansai Paint Co., Ltd.) | 15 parts by weight |

-continued

| | |
|---|---|
| (b) Victoria Pure Blue BOH naphthalenesulfonic acid | 0.1 part by weight |
| (c) Polyurethane ("Sanprene" LQ-T1331 produced by Sanyo Chemical Industries, Ltd.) | 20 parts by weight |
| (d) Dimethylformamide | 85 parts by weight |

The photosensitive layer was coated with the following composition destined to be a heat sensitive layer, and dried at 130° C. for 1 minute, to form a 2 g/m$^2$ thick heat sensitive layer.

| | |
|---|---|
| (a) Nitrocellulose (1/2 second in viscosity, 11.0% in nitrogen content, "Bergerac NC", produced by SNPE Japan K.K.) | (Table 5) |
| (b) Carbon black | (Table 5) |
| (c) Polyester resin ("VYLON 300", produced by Toyobo Co., Ltd.) | 30 parts by weight |
| (d) Modified epoxy resin ("Epoky" 803, produced by Mitsui Toatsu Chemicals, Inc.) | 15 parts by weight |
| (e) Diethyltriamine | 5 parts by weight |
| (f) Methyl isobutyl ketone | 600 parts by weight |

In succession, the heat sensitive layer was coated with a silicone rubber solution with the following composition, and dried at 120° C. for 2 minutes, to form a 3 g/m$^2$ thick silicone rubber layer.

| | |
|---|---|
| (a) Vinylpolydimethylsiloxane | 100 parts by weight |
| (b) Hydrogensiloxane | 12 parts by weight |
| (c) Platinum catalyst | 0.2 part by weight |
| (d) Hardening retarder | 2 parts by weight |
| (e) Silicone Primer "ME-151" (produced by Toshiba Silicone K.K.) | 0.08 part by weight |
| (f) "Isopar E" (produced by Exxon Kagaku K.K.) | 1200 parts by weight |

Onto the laminate obtained as described above, an 8 μm thick polyester film "Lumirror" (produced by Toray Industries, Inc.) was laminated using a calender roller, to obtain a directly imageable raw plate for waterless planographic printing plate.

COMPARATIVE EXAMPLES 8 AND 9

Printing plates were produced as described in Example 14, except that the heat insulating layer and the heat sensitive layer were formed by using the following compositions. Composition of heat insulating layer

| | |
|---|---|
| (a) Kancoat 90T-25-3094 (epoxyphenol resin, produced by Kansai Paint Co., Ltd.) | 15 parts by weight |
| (b) Victoria Pure Blue BOH naphthalenesulfonic acid | 0.1 part by weight |
| (c) Dimethylformamide | 85 parts by weight |

Composition of heat sensitive layer

| | |
|---|---|
| (a) Nitrocellulose (1/2 second in viscosity, 11.0% in nitrogen content, "Bergerac NC", produced by SNPE Japan K.K.) | (Table 5) |
| (b) Carbon black | (Table 5) |

-continued

| | |
|---|---|
| (c) Modified epoxy resin ("Epoky" 803, produced by Mitsui Toatsu Chemicals, Inc.) | 15 parts by weight |
| (d) Diethylenetriamine | 5 parts by weight |
| (e) Methyl isobutyl ketone | 600 parts by weight |

Subsequently, the "Lumirror" film was removed from the original printing plate, and the plate was pulse-exposed to a laser beam of 20 μm in diameter for 10 μs using a semiconductor laser (SLD-304XT, 1 W in output, 809 nm in wavelength, produced by Sony Corp.) mounted on an X-Y table. The laser output was changed as desired by an LD pulse modulation drive, and the laser power on the plate surface was measured, to calculate the sensitivity.

In succession, the plate surface was rubbed by a cotton pad impregnated with a developer with the following composition, for development.

| | |
|---|---|
| (a) Water | 80 parts by weight |
| (b) Diethylene glycol mono-2-ethylhexyl ether | 20 parts by weight |

The image reproducibility of the printing plate was evaluated by a 50-fold magnifying lens, to decide the minimum laser power for forming dots, and from the result, the sensitivity of the printing plate was measured. The result is shown in Table 5.

From Table 5, it can be seen that if the amounts of carbon black and nitrocellulose do not conform to the specified ranges, the sensitivity declines.

EXAMPLE 20

A 0.15 mm thick degreased aluminum sheet was coated with a heat insulating solution with the following composition using a bar coater, and dried at 200° C. for 2 minutes, to form a 4 g/m$^2$ thick heat insulating layer.

| | |
|---|---|
| (a) Polyurethane resin (Sanprene LQ-T1331, produced by Sanyo Chemical Industries, Ltd.) | 90 parts by weight |
| (b) Block isocyanate (Takenate B830, produced by Takeda Chemical Industries, Ltd.) | 35 parts by weight |
| (c) Epoxy.phenol.urea resin (SJ9372, produced by Kansai Paint Co., Ltd.) | 8 parts by weight |
| (d) Dimethylformamide | 725 parts by weight |

In succession, the heat insulating layer was coated with the following, composition destined to be a heat sensitive layer using a bar coater, and dried at 150° C. for 1 minute, to form a 1 g/m$^2$ thick heat sensitive layer.

| | |
|---|---|
| (a) Carbon black | 27 parts by weight |
| (b) Nitrocellulose | 24 parts by weight |
| (c) Water soluble epoxy resin (Denacol EX145, produced by Nagase Kasei K.K.) | 15 parts by weight |
| (d) Amino resin (Yuban 2061, produced by Mitsui Toatsu Chemicals, Inc.) | 14 parts by weight |
| (e) Polyester resin ("Vylon 300", produced by Toyobo Co., Ltd.) | 15 parts by weight |
| (f) Dimethylformamide | 80 parts by weight |
| (g) Methyl isobutyl ketone | 720 parts by weight |

In succession, the heat sensitive layer was coated with the following composition destined to be a silicone rubber layer, and dried at 170° C. for 2 minutes, to form a 2 $g/m^2$ thick silicone rubber layer.

| | |
|---|---|
| (a) Vinyl group-containing polysiloxane | 90 parts by weight |
| (b) Hydrogenpolysiloxane | 8 parts by weight |
| (c) Hardening retarder | 2 parts by weight |
| (d) Catalyst | 0.2 part by weight |
| (e) Silicone Primer "DY39-067" (produced by Toray Dow Corning Silicone K.K.) | 0.8 part by weight |
| (f) "Isopar E" (produced by Exxon Kagaku K.K.) | 1400 parts by weight |

Onto the laminate obtained as described above, an 8 μm thick polyester film "Lumirror" (produced by Toray Industries, Inc.) was laminated using a calender roller, to obtain a directly imageable raw plate for waterless planographic printing plate.

Subsequently the "Lumirror" film was removed from the original printing plate, and the plate was pulse-exposed to a laser beam of 20 μm in diameter for 10 μs using a semiconductor laser (OPC-AOO1-mmm-FC, 0.75 W in output, 780 nm in wavelength, produced by Opto Power Corporation) mounted on an X-Y table.

In succession, the exposed plate was rubbed on the surface by a cotton pad impregnated with water 30 times, for development. The optical densities of the non-exposed area (ink repellent area) and the exposed area (inking area) were measured using a Macbeth optical densitometer, and the peeling degree of the heat sensitive layer on the exposed area was examined. The result is shown in Table 7.

COMPARATIVE EXAMPLE 10

A printing plate was produced as described in Example 20, except that the heat insulating layer, heat sensitive layer and ink repellent layer were formed by the following compositions. Composition of heat insulating layer

| | |
|---|---|
| (a) Kancoat 90T-25-3094 (epoxyphenol resin, produced by Kansai Paint Co., Ltd.) | 15 parts by weight |
| (b) Victoria Pure Blue BOH naphthalenesulfonic acid | 0.1 part by weight |
| (c) Dimethylformamide | 85 parts by weight |
| Composition of heat sensitive layer | |
| (a) Carbon black | 27 parts by weight |
| (b) Nitrocellulose | 24 parts by weight |
| (c) Epoxy resin (Epikote 828, Yuka Shell Epoxy K.K.) | 15 parts by weight |
| (d) Amino resin (Yuban 2061, produced by Mitsui Toatsu Chemicals, Inc.) | 14 parts by weight |
| (e) Dimethylformamide | 80 parts by weight |
| (f) Methyl isobutyl ketone | 720 parts by weight |

Composition of ink repellent layer

| | |
|---|---|
| (a) Polmethylsiloxane (about 35,000 in molecular weight, with hydroxyl groups at the ends) | 100 parts by weight |
| (b) Vinyltrioximesilane | 4 parts by weight |
| (c) Dibutyltin diacetate | 0.3 part by weight |
| (d) "Isopar G" (produced by Exxon Kagaku K.K.) | 1200 parts by weight |

EXAMPLES 21 TO 24

Plates were produced as described in Example 20, except that the water soluble epoxy resin in the heat sensitive layer was substituted by any one of the hydrophilic compounds shown in Table 6, and evaluated. The results are shown in Table 7.

All the plates were good in image reproducibility. From Table 7, it can be seen that the plates containing any water soluble resin had their heat sensitive layers almost perfectly peeled in the inking areas, being improved in plate inspectability, but that the plates not containing any water soluble resin had their heat sensitive layers not removed perfectly, being poor in plate inspectability.

EXAMPLES 25 TO 27, AND COMPARATIVE EXAMPLES 11 AND 12

Waterless planographic printing plates were produced as described in Example 20, except that the heat insulating solution, heat sensitive layer solution and silicone rubber solution used in Example 20 were applied by any of the coating methods shown in Table 8.

From Table 8, it can be seen that a dip coater and air knife coater did not allow well-controlled uniformly thick coating, resulting in poor adhesion between the respective layers, but that a slit die coater, gravure coater and roller coater allowed uniform coating.

EXAMPLES 28 TO 34

A 0.24 mm thick degreased aluminum sheet was coated with a heat insulating solution with the following composition, and dried at 230° C. for 2 minutes, to form a 4 $g/m^2$ thick heat insulating layer.

| | |
|---|---|
| (a) Kancoat 90T-25-3094 (epoxyphenyl resin, produced by Kansai Paint Co., Ltd.) | 15 parts by weight |
| (b) Victoria Pure Blue BOH naphthalenesulfonic acid | 0.1 part by weight |
| (c) Dimethylformamide | 85 parts by weight |

Subsequently, on the heat insulating layer, a heat sensitive layer was formed by vacuum evaporation of the following metal.

| | |
|---|---|
| (a) Metal | (Table 9) |

Furthermore, the heat sensitive layer was coated with a dimethylformamide solution containing 0.5 wt % of allyltrimethoxysilane to form a layer of 500 Å in the calculated dry thickness.

Then, a silicone rubber layer with the following composition was applied, and dried at 120° C. for 2 minutes, to form a 2 $g/m^2$ thick silicone rubber layer.

| | |
|---|---|
| (a) Vinylpolydimethylsiloxane (25,000 in molecular weight, with hydroxyl groups at the ends) | 100 parts by weight |
| (b) Ethyltriacetoxysilane | 12 parts by weight |
| (c) Dibutyltin diacetate | 0.2 parts by weight |
| (d) 3-aminopropyltriethoxysilane | 2 parts by weight |
| (e) "Isopar E" (produced by Exxon Kagaku K.K.) | 1200 parts by weight |

Onto the laminate obtained as described above, an 8 μm thick polyester film "Lumirror" (produced by Toray Industries, Inc.) was laminated using a calender roller, to obtain a directly imageable raw plate for waterless planographic printing plate.

Subsequently the "Lumirror" film was removed from the original printing plate, and the plate was pulse-exposed to a laser beam of 20 μm in diameter for 10 μs using a semiconductor laser (SLD-304XT, 1 W in output, 809 nm in wavelength, produced by Sony Corp.) mounted on an X-Y table. The laser output was changed as desired by an LD pulse modulation drive, and the laser power on the plate surface was measured.

In succession, the plate surface was rubbed by a cotton pad impregnated with a developer with the following composition, for development.

| | |
|---|---|
| (a) Water | 80 parts by weight |
| (b) Diethylene glycol mono-2-ethylhexyl ether | 20 parts by weight |

The image reproducibility of the printing plate was evaluated using a 50-fold magnifying lens, to decide the minimum laser power for forming dots, and from the result, the sensitivity of the printing plate was measured.

The obtained printing plate was installed on an offset press (Komori Sprint Four-Color Machine) for printing on wood-free paper using "Dry-O-Color" black, indigo, red and yellow inks produced by Dainippon Ink & Chemicals, Inc., and the number of printed sheets at which the plate surface was observed to be damaged was identified as the printing durability. The result is shown in Table 9.

COMPARATIVE EXAMPLES 13 TO 15

Printing plates were produced as described in Example 28, except that no silane coupling agent layer was formed on the heat sensitive layer. The results are shown in Table 9.

From Table 9, it can be seen that if the melting point and film thickness of the metal and the optical density do not conform to the specified ranges, the sensitivity of the printing plate declines, and that if there is no silane coupling agent layer, the printing durability declines.

EXAMPLES 35 TO 39

A 0.24 mm thick degreased aluminum sheet was coated with a heat insulating solution with the following composition, and dried at 120° C. for 1 minute, to form a 3 g/m$^2$ heat insulating layer.

| | |
|---|---|
| (a) Ethyl acrylate/acrylic acid/methylmethacrylic acid = a copolymer of 60/20/20 by weight | 100 parts by weight |
| (b) Victoria Pure Blue BOH naphthalenesulfonic acid | 0.1 part by weight |
| (c) Dimethylformamide | 85 parts by weight |

On the heat insulating layer, a heat sensitive layer was formed by vacuum evaporation of the following metal.

| | |
|---|---|
| (a) Metal | (Table 10) |

In succession, on the thin metal film, a thin carbon film of 200 Å in thickness was formed by sputtering, to form a heat sensitive layer consisting of the thin metal film and the thin carbon film.

Furthermore, on the heat sensitive layer, the following silane coupling agent solution was applied, and dried at 120° C. for 2 minutes, to form an adhesive layer.

| | |
|---|---|
| (a) 3-aminopropyltrimethoxysilane | 1 part by weight |
| (b) Ethanol | 1000 parts by weight |

Finally, a silicone rubber solution with the following composition was applied, and dried at 120° C. for 2 minutes, to form a 3 g/m$^2$ thick silicone rubber layer.

| | |
|---|---|
| (a) Vinylpolydimethylsiloxane | 100 parts by weight |
| (b) Hydrogensiloxane | 12 parts by weight |
| (c) Platinum catalyst | 0.2 part by weight |
| (d) Hardening retarder | 2 parts by weight |
| (e) "Isopar E" (produced by Exxon Kagaku K.K.) | 1200 parts by weight |

On the laminate obtained as described above, an 8 μm thick polyester film "Lumirror" (produced by Toray Industries, Inc.) was laminated using a calender roller, to obtain a directly imageable raw plate for waterless planographic printing plate.

Subsequently, the "Lumirror" film was removed from the original printing plate, and the plate was pulse-exposed to a laser beam of 20 μm in diameter for 10 μs using a semiconductor laser (SLD-304XT, 1 W in output, 809 nm in wavelength, produced by Sony Corp.) mounted on an X-Y Table. The laser output was changed as desired by an LD pulse modulation drive, and the laser power on the plate surface was measured.

In succession, the plate surface was rubbed by a cotton pad impregnated with a developer with the following composition, for development.

| | |
|---|---|
| (a) Water | 80 parts by weight |
| (b) Diethylene glycol mono-2-ethylhexyl ether | 20 parts by weight |

The image reproducibility of the printing plate was evaluated using a 50-fold magnifying lens, to decide the minimum laser power for forming dots, and from the result, the sensitivity of the printing plate was measured.

The obtained printing plate was installed on an offset press (Komori Sprint Four-Color Machine), for printing on wood-free paper using "Dry-O-Color" black, indigo, red and yellow inks produced by Dainippon Ink & Chemicals, Inc., and the number of sheets at which the plate surface was observed to be damaged was identified as the printing durability. The result is shown in Table 10.

COMPARATIVE EXAMPLES 16 TO 17

Plates were produced and evaluated as described in Example 35, except that a vapor-deposited film of copper or chromium only was formed as the heat sensitive layer, and that no silane coupling agent layer was formed. The results are shown in Table 10.

From Table 10, it can be seen that if the kind and film thickness of the metal and the optical density do not conform to the specified ranges, the sensitivity of the printing plate declines and that if no silane coupling agent layer is formed, the printing durability of the printing plate declines.

EXAMPLES 40 TO 45

A 0.24 mm thick degreased aluminum sheet was coated with a heat insulating solution with the following composition, and dried at 220° C. for 2 minutes, to form a 4 $g/m^2$ heat insulating layer.

| | |
|---|---|
| (a) Kancoat 90T-25-3094 (epoxyphenol resin, produced by Kansai Paint Co., Ltd.) | 15 parts by weight |
| (b) Victoria Pure Blue BOH naphthalenesulfonic acid | 0.1 part by weight |
| (c) Dimethylformamide | 85 parts by weight |

On the heat insulating layer, a thin carbon film was formed as shown in Table 11 by vapor deposition or sputtering.

In succession, a silicone rubber solution with the following composition was applied, and dried at 120° C. for 2 minutes, to form a 3 $g/m^2$ thick silicone rubber layer.

| | |
|---|---|
| (a) Vinylpolydimethylsiloxane | 100 parts by weight |
| (b) Hydrogensiloxane | 12 parts by weight |
| (c) Platinum catalyst | 0.2 part by weight |
| (d) Hardening retarder | 2 parts by weight |
| (e) "Isopar E" (produced by Exxon Kagaku K.K.) | 1200 parts by weight |

On the laminate obtained as described above, an 8 μm thick polyester film "Lumirror" (produced by Toray Industries, Inc.) was laminated using a calender roller, to obtain a directly imageable raw plate for waterless planographic printing plate.

Subsequently, the "Lumirror" film was removed from the original printing plate, and the plate was pulse-exposed to a laser beam of 20 μm in diameter for 10 μs, using a semiconductor laser (SLD-304XT, 1 W in output, 809 nm in wavelength, produced by Sony Corporation) mounted on an X-Y table. The laser output was changed as desired by an LD pulse modulation drive, and the laser power on the plate surface was measured.

In succession, the plate surface was rubbed by a cotton pad impregnated with a developer with the following composition, for development.

| | |
|---|---|
| (a) Water | 80 parts by weight |
| (b) Diethylene glycol mono-2-ethylhexyl ether | 20 parts by weight |

The image reproducibility of the printing plate was evaluated using a 50-fold magnifying lens, to decide the minimum laser power for forming dots, and from the result, the sensitivity of the printing plate was measured. The result is shown in Table 11.

COMPARATIVE EXAMPLES 18 AND 19

Printing plates were produced and evaluated as described in Example 1, except that a heat sensitive layer of copper only or titanium only was formed by vacuum evaporation. The results are shown in Table 11.

From Table 11, it can be seen that if the thin film thickness and the optical density do not conform to the specified ranges, the sensitivity of the printing plate declines.

TABLE 1

| | Physical properties of heat insulating layer | | | Physical properties of heat sensitive layer | | | Physical properties of heat insulating layer + heat sensitive layer | | |
|---|---|---|---|---|---|---|---|---|---|
| | Initial elastic modulus $kgf/mm^2$ | 5% stress $kgf/mm^2$ | Breaking elongation (%) | Initial elastic modulus $kgf/mm^2$ | 5% stress $kgf/mm^2$ | Breaking elongation (%) | Initial elastic modulus $kgf/mm^2$ | 5% stress $kgf/mm^2$ | Breaking elongation (%) |
| Example 1 | 5 | 0.07 | 655 | 50 | 1.46 | 8 | 42 | 1.27 | 7.0 |
| Example 2 | 60 | 5.90 | 6 | 12 | 0.80 | 11 | 51 | 3.15 | 9.5 |
| Example 3 | 5 | 0.07 | 655 | 110 | 6.50 | 7 | 87 | 4.88 | 6.0 |
| Comparative example 1 | 180 | 5.90 | 2 | 250 | 8.50 | 2 | 205 | 10.20 | 2.0 |
| Comparative example 2 | 180 | 5.90 | 2 | 106 | 7.38 | 4 | 140 | 8.70 | 3.0 |

TABLE 2

| | Image reproducibility | Printing durability (in 10,000 sheets) | Tg of binder resin and crosslinking agent in heat sensitive layer (° C.) |
|---|---|---|---|
| Example 1 | Good | 15 | 16 |
| Example 2 | Good | 10 | 13 |
| Example 3 | Good | 12 | 19 |
| Comparative example 1 | Good | 2 | 110 |
| Comparative example 2 | Good | 5 | 97 |

TABLE 3

| | Carbon black | Grain size of primary grains | Amount (parts by weight) | Blackness | Sensitivity mJ/cm$^2$ | Oil absorption ml/100 g | Physical properties of heat insulating layer kgf/mm$^2$ Initial elastic modulus | 5% stress | Physical properties of heat sensitive layer kgf/mm$^2$ Initial elastic modulus | 5% stress | Physical properties of heat insulating layer + heat sensitive layer kgf/mm$^2$ Initial elastic modulus | 5% stress |
|---|---|---|---|---|---|---|---|---|---|---|---|---|
| Example 4 | #50, produced by Mitsubishi Kasei Corp. | 28 (nm) | 27 | 5 | 460 | 65 | 50 | 2.10 | 80 | 3.55 | 78 | 3.10 |
| Example 5 | MA7, produced by Mitsubishi Kasei Corp. | 24 (nm) | 29 | 4 | 510 | 65 | 52 | 2.15 | 70 | 3.55 | 68 | 3.20 |
| Example 6 | RAVEN 1255, produced by Columbian Carbon Nippon K.K. | 23 (nm) | 29 | 5 | 480 | 56 | 51 | 2.20 | 80 | 3.55 | 76 | 3.30 |
| Example 7 | MOGUL L, produced by Cabot K.K. | 24 (nm) | 31 | 5 | 480 | 60 | 50 | 2.25 | 70 | 3.55 | 68 | 3.25 |
| Example 8 | REGAL 660R, produced by Cabot K.K. | 24 (nm) | 27 | 4 | 500 | 65 | 52 | 2.12 | 90 | 3.55 | 85 | 3.32 |
| Example 9 | #850, produced by Mitsubishi Kasei Corp. | 18 (nm) | 30 | 5 | 315 | 80 | 51 | 2.30 | 80 | 3.55 | 76 | 3.34 |
| Comparative example 3 | ROYAL SP ECTRA, produced by Columbian Carbon Nippon K.K. | 10 (nm) | 29 | 1 | 7500 | 220 | 180 | 5.90 | 250 | 8.50 | 205 | 10.20 |
| Comparative example 4 | VULCAN XC-72, produced by Cabot K.K. | 30 (nm) | 27 | 3 | 2240 | 178 | 180 | 6.00 | 250 | 8.50 | 205 | 9.88 |
| Comparative example 5 | #5B, produced by Mitsubishi Kasei Corp. | 85 (nm) | 12 | 1 | Image could not be formed. | 113 | 180 | 5.80 | 250 | 8.50 | 210 | 10.15 |

TABLE 4

| | Nitrocellulose Compound No. | Reaction time | Viscosity | Nitrogen content | Sensitivity mj/cm$^2$ | Printing durability (in 10,000 sheets) | Physical properties of heat insulating layer Initial elastic modulus kgf/mm$^2$ | 5% stress kgf/mm$^2$ | Physical properties of heat sensitive layer Initial elastic modulus kgf/mm$^2$ | 5% stress kgf/mm$^2$ | Physical properties of heat insulating layer + heat sensitive layer Initial elastic modulus kgf/mm$^2$ | 5% stress kgf/mm$^2$ |
|---|---|---|---|---|---|---|---|---|---|---|---|---|
| Example 10 | 1 | 30 (min) | ⅙ (sec) | 6.0(%) | 780 | 11 | 40 | 2.90 | 70 | 4.53 | 56 | 3.56 |
| Example 11 | 2 | 40 (min) | ¼ (sec) | 8.7(%) | 590 | 11 | 48 | 2.50 | 70 | 4.56 | 62 | 3.26 |
| Example 12 | 3 | 50 (min) | ½ (sec) | 10.9(%) | 520 | 10 | 46 | 2.40 | 82 | 4.55 | 63 | 3.54 |
| Example 13 | 4 | 60 (min) | ⅚ (sec) | 11.2(%) | 510 | 10 | 44 | 2.30 | 90 | 4.49 | 78 | 3.43 |
| Comp. example 6 | 5 | 100 (min) | 5–6 (sec) | 12.0(%) | 410 | 2.8 | 178 | 8.28 | 250 | 8.50 | 205 | 10.20 |
| Comp. example 7 | 6 | 120 (min) | 15–20 (sec) | 12.1(%) | 420 | 1.7 | 178 | 8.20 | 250 | 8.50 | 205 | 10.20 |

TABLE 5

| | Carbon black | Amount (parts by weight) | Amount of nitro-cellulose (parts by weight) | Black-ness | Sensi-tivity | Physical properties of heat insulating layer: Initial elastic modulus kgf/mm$^2$ | Physical properties of heat insulating layer: 5% stress kgf/mm$^2$ | Physical properties of heat sensitive layer: Initial elastic modulus kgf/mm$^2$ | Physical properties of heat sensitive layer: 5% stress kgf/mm$^2$ | Physical properties of heat insulating layer + heat sensitive layer: Initial elastic modulus kgf/mm$^2$ | Physical properties of heat insulating layer + heat sensitive layer: 5% stress kgf/mm$^2$ |
|---|---|---|---|---|---|---|---|---|---|---|---|
| Example 14 | #50, produced by Mitsubishi Kasei Corp. | 20 | 16 | 5 | 460 | 87 | 4.20 | 70 | 4.12 | 75 | 4.19 |
| Example 15 | #50, produced by Mitsubishi Kasei Corp. | 23 | 20 | 4 | 490 | 89 | 4.30 | 70 | 4.15 | 76 | 4.22 |
| Example 16 | RAVEN 1255, produced by Columbian Carbon Nippon K.K. | 17 | 15 | 5 | 440 | 88 | 4.35 | 72 | 4.21 | 76 | 4.30 |
| Example 17 | RAVEN 1255, produced by Columbian Carbon Nippon K.K. | 21 | 11 | 5 | 450 | 95 | 4.78 | 63 | 4.18 | 74 | 4.56 |
| Example 18 | REGAL 660R produced by CABOT k.k. | 26 | 21 | 4 | 510 | 82 | 3.98 | 82 | 4.15 | 82 | 4.05 |
| Example 19 | REGAL 660R produced by CABOT k.k. | 30 | 11 | 5 | 420 | 92 | 4.60 | 62 | 4.25 | 76 | 4.45 |
| Comparative example 8 | #30, produced by Mitsubishi Kasei Corp | 9 | 12 | 1 | 2430 | 180 | 8.30 | 250 | 8.67 | 210 | 8.89 |
| Comparative example 9 | VULCAN XC-72, produced by Cabot K.K. | 11 | 17 | 3 | 2530 | 180 | 8.47 | 250 | 8.66 | 205 | 10.10 |

TABLE 6

| | Hydrophilic compound |
|---|---|
| Example 21 | Denacol EX-512 (water soluble epoxy resin, produced by Yuka Shell Epoxy K.K.) |
| Example 22 | Denacol EX-830 (water soluble epoxy resin, produced by Yuka Shell Epoxy K.K.) |
| Example 23 | Acrylamide/methyl methacrylate copolymer (30/70 by weight) |
| Example 24 | Methacrylic acid/hydroxyethyl acrylate copolymer (40/60 by weight) |

TABLE 7

| | Optical density: Non-exposed area | Optical density: Exposed area | Physical properties of heat insulating layer: Initial elastic modulus kgf/mm$^2$ | Physical properties of heat insulating layer: 5% stress kgf/mm$^2$ | Physical properties of heat sensitive layer: Initial elastic modulus kgf/mm$^2$ | Physical properties of heat sensitive layer: 5% stress kgf/mm$^2$ | Physical properties of heat insulating layer + heat sensitive layer: Initial elastic modulus kgf/mm$^2$ | Physical properties of heat insulating layer + heat sensitive layer: 5% stress kgf/mm$^2$ |
|---|---|---|---|---|---|---|---|---|
| Example 20 | 2.50 | 0.10 | 46 | 2.20 | 85 | 4.21 | 68 | 3.68 |
| Example 21 | 2.50 | 0.15 | 40 | 2.30 | 82 | 4.25 | 58 | 3.78 |
| Example 22 | 2.50 | 0.20 | 46 | 2.48 | 83 | 4.35 | 67 | 3.56 |
| Example 23 | 2.50 | 0.15 | 47 | 2.25 | 82 | 4.24 | 65 | 3.85 |
| Example 24 | 2.50 | 0.15 | 46 | 2.30 | 84 | 4.21 | 64 | 3.76 |
| Comparative example 10 | 2.50 | 0.90 | 180 | 8.10 | 250 | 8.04 | 205 | 10.15 |

TABLE 8

| | Coating method | Coated condition | Physical properties of heat insulating layer | | Physical properties of heat sensitive layer | | Physical properties of heat insulating layer + heat sensitive layer | |
|---|---|---|---|---|---|---|---|---|
| | | | Initial elastic modulus kgf/mm$^2$ | 5% stress kgf/mm$^2$ | Initial elastic modulus kgf/mm$^2$ | 5% stress kgf/mm$^2$ | Initial elastic modulus kgf/mm$^2$ | 5% stress kgf/mm$^2$ |
| Example 25 | Slit die coater | Good | 47 | 2.20 | 82 | 4.22 | 65 | 3.15 |
| Example 26 | Gravure coater | Good | 47 | 2.20 | 82 | 4.22 | 65 | 3.15 |
| Example 27 | Roll coater | Good | 47 | 2.20 | 82 | 4.22 | 65 | 3.15 |
| Comparative example 11 | Dip coater | Irregular in film thickness | — | — | — | — | — | — |
| Comparative example 12 | Air knife coater | Irregular in film thickness | — | — | — | — | — | — |

TABLE 9

| | Metal | Melting point (° C.) | Film thickness (Å) | Optical density | Silane coupling agent layer | Sensitivity mJ/cm$^2$ | Printing durability (in 10,000 sheets) |
|---|---|---|---|---|---|---|---|
| Example 28 | Tellurium | 450 | 280 | 1.9 | Formed | 280 | 9 |
| Example 29 | Tin | 232 | 260 | 1.7 | Formed | 230 | 10 |
| Example 30 | Antimony | 631 | 300 | 1.8 | Formed | 250 | 10 |
| Example 31 | Tellurium/tin | 337 | 260 | 1.4 | Formed | 250 | 11 |
| Example 32 | Tellurium/zinc | 434 | 280 | 1.9 | Formed | 240 | 9 |
| Example 33 | Tellurium/tin/zinc | 367 | 250 | 1.3 | Formed | 250 | 9 |
| Example 34 | Tin/zinc/antimony | 428 | 280 | 1.9 | Formed | 260 | 10 |
| Comparative example 13 | Titanium | 1660 | 1700 | 0.5 | Not formed | Image could not be formed. | 1.1 |
| Comparative example 14 | Copper | 1084 | 1200 | 0.4 | Not formed | 2270 | 0.9 |
| Comparative example 15 | Nickel | 1453 | 1170 | 0.5 | Not formed | Image could not be formed. | 0.8 |

TABLE 10

| | Metal | Melting point (° C.) | Film thickness (Å) | Optical density | Silane coupling agent layer | Sensitivity mJ/cm$^2$ | Printing durability (in 10,000 sheets) |
|---|---|---|---|---|---|---|---|
| Example 35 | Tellurium | 450 | 100 | 2.1 | Formed | 220 | 10 |
| Example 36 | Tin | 232 | 160 | 2.2 | Formed | 250 | 11 |
| Example 37 | Tellurium/tin | 337 | 120 | 2.0 | Formed | 290 | 9 |
| Example 38 | Tellurium/zinc | 434 | 110 | 2.1 | Formed | 370 | 10 |
| Example 39 | Tin/bismuth/zinc | 308 | 130 | 2.2 | Formed | 280 | 10 |
| Comparative example 16 | Copper (heat sensitive layer of copper only) | 1084 | 1200 | 0.4 | Not formed | 2270 | 0.9 |
| Comparative example 17 | Chromium (heat sensitive layer of chromium only) | 1857 | 1120 | 0.4 | Not formed | 3780 | 0.7 |

TABLE 11

| | Thin film forming method | Film thickness (Å) | Optical density | Sensitivity ($mJ/cm^2$) |
|---|---|---|---|---|
| Example 40 | Vacuum evaporation | 190 | 2.2 | 280 |
| Example 41 | Vacuum evaporation | 170 | 2.1 | 250 |
| Example 42 | Vacuum evaporation | 150 | 2.1 | 240 |
| Example 43 | Sputtering | 200 | 2.2 | 210 |
| Example 44 | Sputtering | 190 | 2.1 | 290 |
| Example 45 | Sputtering | 160 | 2.0 | 270 |
| Comparative example 18 | Vacuum evaporation of copper only | 1200 | 0.4 | 2270 |
| Comparative example 19 | Vacuum evaporation of titanium only | 1700 | 0.5 | Image could not be formed. |

INDUSTRIAL APPLICABILITY

The directly imageable raw plate for waterless planographic printing plate of the present invention can be suitably used also for large printing presses and web offset printing presses requiring high printing durability, since it can provide a waterless planographic printing plate high in sensitivity and developability and excellent in printing durability.

What is claimed is:

1. A directly imageable raw plate for waterless planographic printing plate, in which a heat insulating layer, a heat sensitive layer comprising a light to heat converting material and an ink repellent layer are formed in this order on a substrate, comprising physical properties of 5 to 100 $kgf/mm^2$ in initial elastic modulus and 0.05 to 5 $kgf/mm^2$ in 5% stress as tensile properties of the heat sensitive layer or a laminate comprising the heat sensitive layer and the insulating layer.

2. A directly imageable raw plate for waterless planographic printing plate according to claim 1, wherein the heat sensitive layer is composed of a light-heat converting material, self oxidizing material and resin, and the light-heat converting material is furnace carbon black of 15 to 29 nm in the average grain size of primary grains and 50 to 100 ml/100 g in oil absorption.

3. A directly imageable raw plate for waterless planographic printing plate according to claim 1, wherein the heat sensitive layer is composed of a light-heat converting material, self oxidizing material and resin, and the self oxidizing material is nitrocellulose of 1/16 to 3 seconds in the viscosity according to ASTM D301-72 and 11.5% or less in nitrogen content.

4. A directly imageable raw plate for waterless planographic printing plate according to claim 1, wherein the heat sensitive layer is composed of carbon black, nitrocellulose and resin, and the ratio by weight of carbon black and nitrocellulose is carbon black: nitrocellulose=1.1 or more:1.

5. A directly imageable raw plate for waterless planographic printing plate according to claim 4, wherein the sum of weights of carbon black and nitrocellulose in the heat sensitive layer is 30 to 90 wt % based on the weight of the entire composition of the heat sensitive layer, and the thickness of the heat sensitive layer is 0.2 to 3 $g/m^2$.

6. A directly imageable raw plate for waterless planographic printing plate according to claim 1, wherein the silane coupling agent is an unsaturated group-containing silane coupling agent.

7. A directly imageable raw plate for waterless planographic printing plate according to claim 1, wherein the heat sensitive layer is composed of a light-heat converting material, self oxidizing material and resin, and the light-heat converting material is furnace carbon black of 15 to 29 nm in the average grain size of primary grains and 50 to 100 ml/100 g in oil absorption.

8. A directly imageable raw plate for waterless planographic printing plate according to claim 1, wherein the heat sensitive layer is composed of a light-heat converting material, self oxidizing material and resin, and the self oxidizing material is nitrocellulose of 1/16 to 3 seconds in the viscosity according to ASTM D301-72 and 11.5% or less in nitrogen content.

9. A directly imageable raw plate for waterless planographic printing plate according to claim 1, wherein the heat sensitive layer is composed of carbon black, nitrocellulose and resin, and the ratio by weight of carbon black and nitrocellulose is carbon black: nitrocellulose=1.1 or more:1.

10. A directly imageable raw plate for waterless planographic printing plate according to claim 9, wherein the sum of weights of carbon black and nitrocellulose in the heat sensitive layer is 30 to 90 wt % based on the weight of the entire composition of the heat sensitive layer, and the thickness of the heat sensitive layer is 0.2 to 3 $g/m^2$.

11. A directly imageable raw plate for waterless planographic printing plate according to any one of claims 1 through 10, wherein the heat sensitive layer is composed of a light-heat converting material, self oxidizing material and crosslinked resin, and the glass transition point (Tg) of the resin is 20° C. or lower.

12. A directly imageable raw plate for waterless planographic printing plate according to claim 11, wherein the heat sensitive layer contains 10 to 40 wt % of at least one or more materials selected from salts, monomers, oligomers and resins capable of being dissolved in or swollen by water.

13. A directly imageable raw plate for waterless planographic printing plate according to any one of claim 1 through 10, wherein the heat sensitive layer contains 10 to 40 wt % of one or more materials selected from salts, monomers, oligomers and resins capable of being dissolved in or swollen by water.

14. A method for producing the directly imageable raw plate of claim 1, comprising coating the substrate with the heat insulating layer, the sensitive layer and the ink repellent layer in this order.

15. The method for producing directly imageable raw plate of claim 14, wherein said coating step is selected from the group consisting of die coating, gravure coating and roller coating.

16. A waterless planographic printing plate, prepared by selectively imaging on the directly imageable raw plate for waterless planographic printing plate according to claim 1, and developing it.

17. The directly imageable raw plate for waterless planographic printing plate according to claim 1, wherein said ink repellent layer comprises a silicone rubber.

18. The directly imageable raw plate for waterless planographic printing plate according to claim 1, wherein said ink repellent layer comprises silane coupling agent.

19. The directly imageable raw plate for waterless planographic printing plate of claim 1, wherein the heat sensitive layer comprises a thin metal film of 657° C. or lower in melting point and 1000 Å or less in thickness and the ink repellent layer comprises a silicone rubber and a silane coupling agent.

20. A directly imageable raw plate for waterless planographic printing plate, in which a heat insulating layer, heat sensitive layer and ink repellent layer are formed on a substrate, wherein the heat sensitive layer comprises a thin carbon film and a thin metal film of 1727° C. or lower in melting point and 1000 Å or lower in total thickness.

21. A directly imageable raw plate for waterless planographic printing plate according to claim 19 or 20, wherein the optical density of the heat sensitive layer is 0.6 to 2.3.

22. A directly imageable raw plate for waterless planographic printing plate according to claim 19 or 20, wherein the heat sensitive layer is formed by vacuum evaporation or sputtering.

* * * * *